United States Patent
Arita et al.

(10) Patent No.: US 6,236,076 B1
(45) Date of Patent: May 22, 2001

(54) FERROELECTRIC FIELD EFFECT TRANSISTORS FOR NONVOLATILE MEMORY APPLICATIONS HAVING FUNCTIONAL GRADIENT MATERIAL

(75) Inventors: Koji Arita; Carlos A. Paz de Araujo, both of Colorado Springs, CO (US)

(73) Assignees: Symetrix Corporation, Colorado Springs, CO (US); Matsushita Electronics Corporation (JP)

(*) Notice: Subject to any disclaimer, the term of this patent is extended or adjusted under 35 U.S.C. 154(b) by 0 days.

(21) Appl. No.: 09/301,867

(22) Filed: Apr. 29, 1999

(51) Int. Cl.⁷ .......................... H01L 29/76; H01L 29/94; H01L 31/062

(52) U.S. Cl. .......................... 257/295; 257/213; 257/288

(58) Field of Search .................................. 257/213, 288, 257/295, 903

(56) References Cited

U.S. PATENT DOCUMENTS

| | | |
|---|---|---|
| 2,791,758 | 5/1957 | Looney . |
| 2,791,759 | 5/1957 | Brown . |
| 2,791,760 | 5/1957 | Ross . |
| 2,791,761 | 5/1957 | Morton . |
| 2,876,436 | 3/1959 | Anderson . |
| 5,272,341 | 12/1993 | Micheli et al. . |
| 5,434,102 | 7/1995 | Watanabe et al. . |
| 5,468,684 | 11/1995 | Yoshimori et al. . |
| 5,508,226 | 4/1996 | Ito et al. . |
| 5,523,964 | 6/1996 | McMillan et al. . |
| 5,536,672 | 7/1996 | Miller et al. . |
| 5,559,733 | 9/1996 | McMillan et al. . |
| 5,736,759 | 4/1998 | Haushalter . |
| 5,744,374 | 4/1998 | Moon . |

OTHER PUBLICATIONS

Shu–Yau Wu, "A New Ferroelectric Memory Device, Metal–Ferroelectric– Semiconductor Transistor," IEEE Transactions On Electron Devices, vol. ED–21 (No. 8), pp. 499–504 (Aug., 1974).

S.Y. Wu, "Memory Retention And Switching Behavior Of Metal–Ferroelectric–Semiconductor Transistors," Ferroelectrics, Gordon and Breach Science Publishers Ltd. (Great Britain), pp. 379–383 (1976).

Scott et al., "Integrated Ferroelectrics," Condensed Matter News, vol. 1 (No. 3), pp. 16–20 (1992).

McMillan et al., "Process Development and Integration of Non–Destructive Readout (NDRO) Ferroelectric Memory," Defense Nuclear Agency Technical Report, Contract No. DNA 001–90–C–0004, pp. 7–13 (Sep., 1993).

Hirai et al., "Formation of Metal/Ferroelectric/Insulator/ Semiconductor Structure with a CeO2 Buffer Layer," Jpn. J. Appl. Phys., vol. 33 (Part 1, No. 9B), pp. 5219–5221 (Sep., 1994).

(List continued on next page.)

*Primary Examiner*—Matthew Smith
*Assistant Examiner*—Lex H. Malsawma
(74) *Attorney, Agent, or Firm*—Duft, Graziano & Forest, P.C.

(57) ABSTRACT

A nonvolatile nondestructible read-out ferroelectric FET memory comprising a semiconductor substrate, a ferroelectric functional gradient material ("FGM") thin film, and a gate electrode. In one basic embodiment, the ferroelectric FGM thin film contains a ferroelectric compound and a dielectric compound. The dielectric compound has a lower dielectric constant than the ferroelectric compound. There is a concentration gradient of the ferroelectric compound in the thin film. In a second basic embodiment, the FGM thin film is a functional gradient ferroelectric ("FGF"), in which compositional gradients of ferroelectric compounds result in unconventional hysteresis behavior. The unconventional hysteresis behavior of FGF thin films is elated to an enlarged memory window in ferroelectric FET memories. FGM thin films are preferably formed using a liquid source MOD methods, preferably a multisource CVD method.

29 Claims, 17 Drawing Sheets

OTHER PUBLICATIONS

Chen et al., "Modeling Of Metal–Ferroelectric–Semiconductor Field Effect Transistor Subthreshold Current," Integrated Ferroelectrics, Overseas Publishers Association (Amsterdam B.V.), pp. 265–274 (1994).

Nakamura et al., "Preparation of Pb(Zr,Ti)O3 thin films on electrodes including IrO2," Appl. Phys. Lett., vol. 65 (No. 12), pp. 1522–1524 (Sep. 19, 1994).

Hirai et al., "Characterization of Metal/Ferroelectric/Insulator/ Semiconductor Structure with CeO2 Buffer Layer," Jpn. J. Appl. Phys., vol. 34 (Part 1, No. 8A), pp. 4163–4166 (Aug. 1995).

T. Nakamura, "FFRAM," Ferroelectric Thin Film Memory, pp. 261–271 (1995).

Katoh et al., "Non–Volatile FCG (Ferroelectric–Capacitor and Transistor–Gate Connection) Memory Cell with Non–Destructive Read–Out Operation," 1996 Symposium on VLSI Technology Digest of Technical Papers, IEEE, pp. 56–57 (1996).

Hirai et al., "Crystal and Electrical Characterizations of Epitaxial CexZr1–xO2 Buffer Layer for the Metal/Ferroelectric/Insulator/ Semiconductor Field Effect Transistor," Jpn. J. Appl. Phys., vol. 35 (Part 1, No. 9B), pp. 5150–5153 (Sep., 1996).

Kim et al., "Memory window of Pt/SrBi2Ta2O9/CeO2/ SiO2/Si structure for metal ferroelectric insulator semiconductor field effect transistor," Appl. Phys. Lett. American Institute of Physics, vol. 71 (No. 24), pp. 3507–3509 (Dec. 15, 1997).

Shin et al., "A Proposal of Pt/SrBi2Ta2O9/CeO2/Si Structure for Non Destructive Read Out Memory Devices," Extended Abstracts of the 1997 International Conference on Solid State Devices and Materials, pp. 32–33 (1997).

Tokumitsu et al., "Electrical Properties Of Ferroelectric–Capacitor–Gate Si MOS Transistors Using P(L)ZT Films," Integrated Ferroelectrics, Overseas Publishers Association (Amsterdam B.V.), pp. 137–144 (1997).

Auciello et al., "The Physics of Ferroelectric Memories," Physics Today, American Institute of Physics, pp. 22–27 (Jul., 1998).

Schubring et al., "Charge Pumping and Pseudopyroelectric Effect in Active Ferroelectric Relaxor–Type Films," Physical Review Letters, The American Physical Society, vol. 65, (No. 11), pp. 1778–1781 (Mar. 16, 1992).

Mantese et al., "Ferroelectric thin films with polarization gradients normal to the growth surface," Appl. Phys. Lett. American Institute of Physics, vol. 67 (No. 5), pp. 721–723 (Jul. 31, 1995).

Mantese et al., "Slater model applied to polarization graded ferroelectrics," Appl. Phys. Lett., American Institute of Physics, vol. 71, No. 14), pp. 2047–2049 (Oct. 6, 1997).

Brazier et al., "Unconventional hysteresis behavior in compositionally graded Pb(Zr,Ti)O3 thin films," Appl. Phys. Lett., American Institute of Physics, vol. 72 (No. 9), pp. 1121–1123 (Mar. 2, 1998).

Chen et al., "Graded PZT Thin Film Capacitors with Stoichimetric Variation by MOD Technique," Integrated Ferroelectrics, pp. 181–188 (1999).

FERROELECTRIC FIELD EFFECT TRANSISTORS FOR NONVOLATILE MEMORY APPLICATIONS HAVING FUNCTIONAL GRADIENT MATERIAL

BACKGROUND OF THE INVENTION

1. Field of the Invention

This invention relates to ferroelectric field effect transistors, and more particularly to ferroelectric memories utilizing such transistors and methods of fabricating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. Destructive reading followed by rewriting generally requires operating a memory with two transistors and two capacitors ("2T–2C"), which reduces overall circuit density and efficiency, as well as increased manufacturing costs.

It has been postulated for at least 40 years, however, that it may be possible to design a nonvolatile, nondestructive read-out ("NDRO") memory in which the memory element is a single ferroelectric field effect transistor ("FET"), thereby reducing at least some of the complexity of conventional 2T–2C operation. See Shu-Yau Wu, "A New Ferroelectric Memory Device, Metal-Ferroelectric-Semiconductor Transistor", in IEEE *Transactions On Electron Devices*, pp. 499–504, August 1974; S. Y. Wu, "Memory Retention and Switching Behavior Of Metal-Ferroelectric-Semiconductor Transistors", in *Ferroelectrics*, Vol. 11, pp. 379–383, 1976; and J. R. Scott, C. A. Paz de Araujo, and L. D. McMillan, "Integrated Ferroelectrics", in *Condensed Matter News*, Vol. 1, No. 3, pp. 15–20, 1992. Because the ferroelectric memory effect measured in the early devices of Wu was only a temporary, single state effect rather than a long lived two state effect, it is now believed that this effect was charge injection effect rather than an effect due to ferroelectric switching.

A structure well-known in the art is the so-called metal-ferroelectric-semiconductor FET ("MFS-FET"), in which a ferroelectric oxide is formed on the semiconductor substrate, and the metal gate electrode is located on the ferroelectric oxide. When a ferroelectric thin film, such as PZT, is formed directly on a semiconductor substrate, such as silicon, high leakage current, low retention times and fatigue are common problems. It is commonly believed in the art that some of this is a result of a poor interface between ferroelectric oxides and silicon. The poor interface may be a result of incompatibility of crystalline ferroelectric oxides with the crystal lattices and thermal coefficients of silicon.

Also, when a thin film of ferroelectric oxide is in direct electrical connection with the gate oxide layer of the transistor gate, it is difficult to apply sufficient voltage to the ferroelectric thin film to switch its polarization. A ferroelectric thin film and a gate oxide may be viewed as two capacitors in series. The dielectric constant of the ferroelectric thin film (usually 100–1000) is much higher than the dielectric constant of typical gate oxides (usually about 3–5). As a result, most of the voltage drop occurs across the low dielectric constant material, and an extra high operational voltage is required to switch the polarization of the ferroelectric thin film. This can lead to electrical breakdown of the gate oxide and other materials in the circuit. Further, a high operational voltage in excess of 3–5 volts would render the device incompatible with conventional integrated circuit art.

To reduce interface problems, structures have been designed in which an insulating oxide layer, such as $CeO_2$ or $Y_2O_3$, is sputter-deposited on the semiconductor substrate before depositing the ferroelectric layer and gate. Such a structure is referred to in the art as a metal-ferroelectric-insulator-semiconductor FET ("MFIS-FET"). Recently, a MFIS-FET device has been reported that appears to show true ferroelectric memory behavior. See Tadahiko Hirai et al., "Formation of Metal/Ferroelectric/Insulator/Semiconductor Structure With A $CeO_2$ Buffer Layer", in Japan *Journal of Applied Physics*, Vol. 33, Part I, No. 9B, pp. 5219–5222, September 1994; Tadahiko Hirai et al., "Characterization of Metal/Ferroelectric/Insulator/Semiconductor Structure With A $CeO_2$ Buffer Layer", in *Japan Journal of Applied Physics*, Vol. 34, Part I, No. 8A, pp. 4163–4166, August 1995; Yong Tae Kim et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, 15 December 1997, pp. 3507–3509; and U.S. Pat. No. 5,744,374 issued Apr. 28, 1998 to Jong Moon. It is believed that an insulator layer located on the silicon substrate between the substrate and the ferroelectric thin film avoids the problems caused by a ferroelectric-semiconductor interface.

Although the use of an insulating layer addresses the interface problems in MFIS-FETs and other structurally related memories, the problem of insufficient voltage for switching the polarization in the ferroelectric material persists. A related problem is that polarization charging of many conventional ferroelectric materials is insufficient for reliable memory operation. Polarization charging of a ferroelectric material is necessary for proper functioning of the ferroelectric in storing a binary bit of information. Polarization charging can be expressed as the threshold voltage shift, or "memory window", $\Delta V$, calculated by measuring the maximum voltage difference between the backward and forward sweeps during a standard capacitance-voltage measurement of a ferroelectric capacitor. The memory windows measured in ferroelectric FET devices of the prior art are commonly less than one volt, which makes the memory device subject to undesired polarization switching and unreliable information storage.

SOLUTION

The invention solves the problems described above by providing a novel ferroelectric nondestructive read-out ("NDRO") memory device, and a method of making such memory device.

The device of the invention is a ferroelectric FET having a thin film of a ferroelectric functional gradient material ("FGM"), or functionally graded material. In one basic embodiment of the invention, a FGM thin film contains a ferroelectric compound and a dielectric compound, wherein the dielectric compound has a dielectric constant less than the dielectric constant of the ferroelectric compound. The ferroelectric FGM thin film is characterized by a molar concentration gradient of the ferroelectric compound between regions of the FGM thin film. The concentration gradient may be gradual or it may be stepwise. Typically, there is also a concentration gradient of the dielectric compound in the ferroelectric FGM thin film, usually in a sense opposite to the direction of the gradient of the ferroelectric compound. As a result of the functional gradient, the overall dielectric constant of the ferroelectric FGM thin film is lower than if no dielectric compound were present. Therefore, the available voltage drop across the ferroelectric FGM thin film available for switching its polarization is correspondingly greater. At the same time, however, the ferroelectric properties of the ferroelectric FGM thin film remain. Thus, in this first basic embodiment, the ferroelectric FET containing the ferroelectric FGM thin film functions well as a ferroelectric nonvolatile NDRO memory.

In the first basic embodiment, when the concentration of the dielectric compound is high near the interface of the ferroelectric FGM thin film with the semiconductor substrate of the ferroelectric FET, then the dielectric compound also functions as an interface insulator material, reducing the interface problems arising when some ferroelectric compounds, for example, ferroelectric metal oxides, are in close proximity to semiconductor substrates such as silicon.

In a second basic embodiment of the invention, the FGM thin film is a functional gradient ferroelectric ("FGF"), or functionally graded ferroelectric, thin film. In a FGF thin film, the concentration of a plurality of ferroelectric compounds varies across the thin film. Typically, the molar concentration of a plurality of ferroelectric compounds in a class of compounds having similar crystal structures is varied across the FGF thin film. The changing concentration of different compounds is a result of a change in the relative amounts of one or more types of metals across the thin film. For example, a FGF thin film may contain the metal types strontium, bismuth, tantalum and niobium in relative molar proportions corresponding to a generalized stoichiometric formula $SrBi_2(Ta_{1-x}Nb_x)_2O_9$, where x may vary in a range of $0 \leq x \leq 1$. The generalized stoichiometric formula represents a class of ferroelectric layered superlattice material compounds with similar crystal structures. A concentration gradient of tantalum and niobium corresponding to changes in the value of x represents a functional gradient of the ferroelectric compounds. The term "type of metal" and similar terms refer to a type of atom corresponding to a chemical element from the periodic table of chemical elements. For example, titanium, zirconium, tantalum, niobium and lanthanum are five different types of metal. A ferroelectric FET according to the invention in which the FGM thin film is a FGF thin film has a larger memory window, $\Delta V$, for polarization charging than ferroelectric FET memories having conventional ferroelectric materials.

Ferroelectric compounds of the invention can be selected from a group of suitable ferroelectric materials, including but not limited to: $ABO_3$-type metal oxide perovskites, such as a titanate (e.g., $BaTiO_3$, $SrTiO_3$, $PbTiO_3$, $PbZrTiO_3$) or a niobate (e.g., KNbO3), and, preferably, layered superlattice compounds.

A method of the invention for fabricating a FGM thin film includes applying sequentially a plurality of precursor solutions to a substrate to form a functional gradient. The relative concentrations of types of metals in the precursor solutions varies, corresponding to the functional gradient desired.

According to the invention, the ferroelectric FGM thin film may be applied using any number of techniques for applying thin films in integrated circuits. Preferably, metal organic precursors suitable for metal organic decomposition ("MOD") techniques of thin film deposition are used. MOD methods enable convenient and accurate control of precursor concentrations. Preferably, a multisource chemical vapor deposition ("CVD") method is used. In the preferred method of the invention, the mass flow rates of individual precursor streams into the final precursor mixture applied to the substrate are individually and accurately varied during the course of the deposition process to form the inventive functional gradients in the ferroelectric FGM thin film.

In preferred embodiments, the write bias is applied between the substrate and the FET gate.

Preferably, the cell is read by sensing the source/drain current when a voltage difference is placed across the source and drain.

The invention not only provides a simpler and much more dense ferroelectric memory, but also provides one that can be manufactured easily. Numerous other features, objects and advantages of the invention will become apparent from the following description when read in conjunction with the accompanying drawings.

DETAILED DESCRIPTION OF THE PREFERRED EMBODIMENT

1. Introduction

Figure 1:
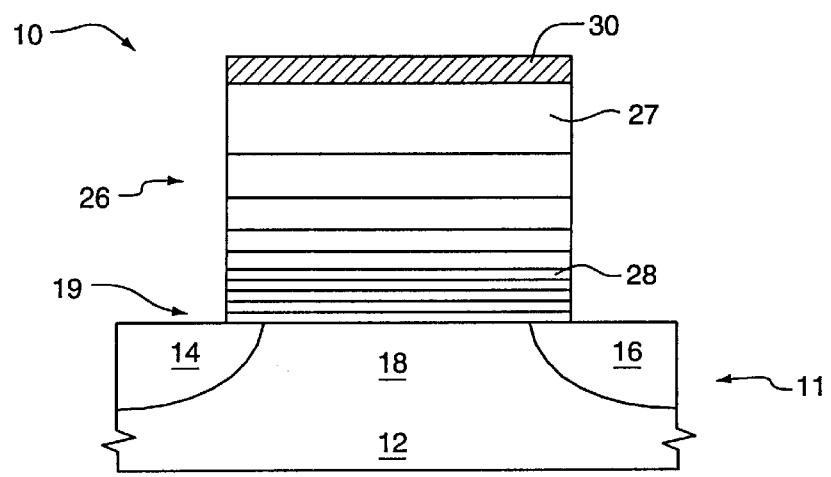
FIG. 1 shows a cross-sectional view of a portion of a ferroelectric FET memory according to the invention, in which the molar concentration gradient of the ferroelectric compound in the ferroelectric FGM thin film is negative in the downwards direction.

A functional gradient material ("FGM"), also known as a functionally graded material, generally is a material in which the concentration of at least one particular chemical species changes from one region of the material to another. The chemical species may be a chemical element or a chemical compound. The concentrations and the concentration gradient are controlled to some degree in order to achieve one or more functional advantages over materials in which there is no concentration gradient. Thus, the term "functional gradient" refers to a material in which a concentration gradient of a chemical species results in a functional advantage compared to a material in which there is no similar concentration gradient. The rate of change in concentration from region to region of the material, that is, the concentration gradient, may be gradual or in discrete steps. The gradient may also be uniform or nonuniform; that is, the incremental change in concentration per unit distance may be uniform throughout the material, or it may increase or decrease spatially. The concentration gradient in thin films of the integrated circuit art typically is oriented in the vertical direction, where the vertical direction is normal to the plane of the semiconductor wafer surface. In a FGM thin film, a gradual functional concentration gradient may be achieved by diffusion; that is, a high concentration of a chemical species may be deposited in one region of the material, and then the chemical species diffuses into other regions of the material. In the preferred method of the present invention, the concentration gradient is achieved by changing the composition of liquid precursors, sequentially applying the liquid precursors to a substrate, and treating the substrate to form a solid ferroelectric FGM thin film.

In one basic embodiment of the invention, the concentrations of both a ferroelectric compound and a dielectric compound in a FGM thin film change in the vertical direction with respect to the semiconductor wafer plane. Thus, two concentration gradients are present in the FGM thin film. The gradient of one of the compounds is positive in the upward direction, while the gradient of the other compound is negative in the upward direction. In a second basic embodiment, there is a concentration gradient of one or more metal atoms that are present with other chemical elements in relative molar proportions for forming ferroelectric compounds with similar crystalline structures. Such a FGM thin film is a functional gradient ferroelectric ("FGF") thin film.

A lateral region in a FGM thin film of the invention is a region of some thickness, either infinitesimal or finite, in which the lateral direction is a plane in the horizontal direction, that is, a plane parallel to the semiconductor wafer surface, and in which the concentrations of the chemical species are uniform. It is possible for a FGM of the invention to have just two lateral regions, so that the chemical composition of the FGM thin film changes abruptly, in a stepwise manner, from one region to the second. Such a structure is obtained when a precursor with a given composition is used to form one lateral region with finite thickness, and then a precursor with a second composition is used to form a second lateral region. More typical and preferred is a FGM thin film comprising more than two lateral regions, preferably, one in which the concentration gradient through the FGM thin film in the vertical direction is gradual. This gradual concentration gradient is achieved by depositing the thin film using mixtures of liquid precursors in which the relative concentrations of the various individual precursors in the mixture are gradually changed.

Typically, a final liquid precursor used to form a lateral region of the FGM thin film contains precursor compounds for forming a plurality of solid compounds, and the exact solid structure of the resulting lateral region formed generally cannot be known with absolute certainty, as a rule. This is especially true if the several solid compounds possess different crystal structures; for example, when precursors for ferroelectric $SrBi_2Ta_2O_9$ are mixed with precursors for dielectric $ZrO_2$. For example, if the precursor compounds of one particular compound predominate, such as being 90% or more of the total molar concentration of the final precursor, then the structure might be viewed in some instances as the predominant compound containing dopants. When the final precursor includes significant proportions of a plurality of compounds, however, then the crystal structure is not obvious. The lateral region may comprise a heterostructure in which crystalline grains of a plurality of chemical compounds corresponding to the precursors are interspersed, or other unexpected chemical compounds, crystal structures and amorphous materials may result. In contrast, when the final precursor contains precursor compounds for forming compounds having similar crystal structures, then it is more likely that the lateral region formed comprises a single known type of crystal structure. For example, if a final precursor contains precursor compounds containing metal atoms in relative proportions corresponding to the generalized stoichiometric formula $PbZr_{0.6}Ti_{0.4}O_3$, then the lateral region likely comprises a homogeneous crystal structure for an $ABO_3$-type perovskite in which 60% of the B-sites are occupied by a zirconium atom, and 40% of the B-sites are occupied by a titanium atom. In any case, usually only crystallographic analysis of each lateral region of a FGM thin film can verify the actual molecular and crystalline structures present. Nevertheless, in this specification, the composition of the lateral region may be described by referring to the relative molar proportions of metal atoms as represented by a stoichiometric formula of a chemical compound or compounds; or, for the sake of clarity, the lateral region may be described as comprising one or several molecular compounds corresponding to the precursor used. While the precursor formulation and the stoichiometric formula of the resulting material are certain, it is understood, however, as explained above, that the actual presence of the compounds named for a given lateral region is not always certain.

A ferroelectric FET according to the invention comprises a semiconductor substrate, a ferroelectric FGM thin film, and a gate electrode. In one embodiment, the ferroelectric FGM thin film contains a ferroelectric compound and a dielectric compound, wherein the dielectric compound has a dielectric constant less than the dielectric constant of the ferroelectric compound. Further, the ferroelectric FGM thin film has at least two lateral regions, a first lateral region and a second lateral region. The first lateral region contains a first molar concentration of the ferroelectric compound, and the second lateral region contains a second molar concentration of the ferroelectric compound. The molar concentration of the ferroelectric compound in each of the two lateral regions must me nonzero in a ferroelectric FGM material. If there are more than two lateral regions, one of the lateral regions can have a zero concentration. The first lateral region contains a first molar concentration of the dielectric compound, and the second lateral region contains a second molar concentration of the dielectric compound. The molar concentration of the dielectric compound in each of the two lateral regions must be nonzero in a dielectric FGM material, though if there are more than two lateral regions, one may have a zero concentration. That is, the term FGM should not be interpreted to read on a two layer structure in which one layer is ferroelectric and the other layer is dielectric and not ferroelectric. It also should not be interpreted to read on a structure in which the ferroelectric materials in the two layers are unrelated. Typically, the molar concentration of the ferroelectric compound in the first lateral region is greater than the molar concentration of the dielectric compound in the first lateral region. Also, the molar concentration of the ferroelectric compound in the first lateral region is greater than the molar concentration of the ferroelectric compound in the second lateral region. Thus, there is a negative concentration gradient of the ferroelectric compound from the first lateral region to the second lateral region. In a ferroelectric FGM thin film of the invention, a gradient of the molar concentrations of the dielectric compound exists between the first lateral region and the second lateral region such that the molar concentration of the dielectric compound in the second lateral region is greater than the molar concentration of the dielectric compound in the first lateral region. Thus, there is a positive concentration gradient of the dielectric compound from the first lateral region to the second lateral region. Often, the ferroelectric compound is present in the first lateral region, and the dielectric compound is substantially absent in the first lateral region. Typically, the molar concentration of the dielectric compound in the second lateral region is greater than the molar concentration of the ferroelectric compound in the second lateral region. Often, the ferroelectric compound is substantially absent in the second lateral region. Similarly, the dielectric compound is often substantially absent from the second lateral region. "Substantially absent" means a relative molar concentration less than one percent.

The molar concentrations of the ferroelectric compound and the dielectric compound are usually conceptualized and expressed as relative molar proportions or percentages in a particular lateral region of the solid ferroelectric FGM thin film; for example, "a lateral region comprising 80 mole-percent ferroelectric compound and 20 mole-percent dielectric compound". Similarly, a final liquid precursor for forming a particular lateral region of a FGM thin film is usually described having a particular molar concentration, for example, "0.1M", with a molar percentage composition, for example, "80% ferroelectric and 20% dielectric". As explained above, a ferroelectric FGM thin film according to the invention may comprise two or more lateral regions, in each of which the concentrations of the constituent chemical species is uniform. A key feature of the first basic embodiment of the invention is that there is a concentration gradient of at least one chemical species, the ferroelectric compound, from one lateral region to the next.

Ferroelectric compounds of the invention can be selected from a group of suitable ferroelectric materials, including but not limited to: $ABO_3$-type metal oxide perovskites, such as a titanate (e.g., $BaTiO_3$, $SrTiO_3$, $PbTiO_3$, $PbZrTiO_3$) or a niobate (e.g., $KNbO3$), and, preferably, layered superlattice compounds. U.S. Pat. No. 5,519,234 issued May 21, 1996, to Araujo et al., incorporated herein by reference, discloses that layered superlattice compounds, such as strontium bismuth tantalate (SBT), have excellent properties in ferroelectric applications as compared to the best prior art materials and have high dielectric constants and low leakage currents.

The layered superlaftice materials may be summarized generally under the formula:

$$A1^{+a1}_{w1} A2^{+a2}_{w2} \ldots Aj^{+aj}_{wj} S1^{+s1}_{x1} S2^{+s2}_{x2} \ldots Sk^{+sk}_{sk} B1^{+b1}_{y1} B2^{+b2}_{y2} \ldots Bl^{+bl}_{yl} Q^{-q}_{z}, \quad (1)$$

where
A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements. For example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material, e.g. in $SrBi_2(Ta_{0.75}N_{0.25})_2O_9$, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz.$$

Formula (1) includes all three of the Smolenskii type compounds discussed in U.S. Pat. No. 5,519,234 issued May 21, 1996, to Araujo et al., which is hereby incorporated by reference as though fully incorporated herein. The layered superlattice materials do not include every material that can be fit into Formula (1), but only those which spontaneously form themselves into crystalline structures with distinct alternating layers. It has been shown that certain layered superlattice materials possess characteristics well-suited for conventional nonvolatile memory applications, such as high polarizability, high resistance to fatigue, low leakage current, low imprint, and suitable coercive voltage values. But the high dielectric constant values of 350–400 of the layered superlattice materials cause the switching problem described above for ferroelectric FET memories. The structure of the first basic embodiment of the invention and the inventive method for fabricating it reduce the overall dielectric constant of the ferroelectric FGM thin film.

In the second basic embodiment of the invention, the composition of ferroelectric material changes between lateral regions. This type of FGM thin film is referred to as a FGF thin film. In contrast to the FGM thin film of the first embodiment, the presence of a compound with a low dielectric constant is not required to achieve the functional advantage of an enlarged memory window, $\Delta V$. The functional concentration gradient in a FGF thin film is a change in concentration of a ferroelectric compound between lateral regions. Typically, the relative concentrations of a plurality of ferroelectric compounds having similar crystal structures change between lateral regions as a result of substitution of one metal atom for another. For example, both $PbZrO_3$ and $PbTiO_3$ have a similar $ABO_3$-type crystal structure. If the final precursor used to form a lateral region contains precursor compounds having metals with relative molar concentrations corresponding to $PbZr_{0.6}Ti_{0.4}O_3$, then the material of the lateral region can be viewed as an $ABO_3$-type crystal structure containing two molecular compounds. Sixty percent of the crystalline molecules are $PbZrO_3$, and 40% are $PbTiO_3$. As the concentration of metal atoms changes between lateral regions, the concentration of the ferroelectric compounds changes. If, in the example above, a precursor with relative molar concentrations corresponding to $PbZr_{0.7}Ti_{0.3}O_3$ is used to form another lateral region, then the lateral region can be viewed as an $ABO_3$-type crystal structure containing 70% $PbZrO_3$ and 30% $PbTiO_3$. Thus, the FGF thin film can be viewed as a material in which there are functional gradients of the two compounds $PbZrO_3$ and $PbTiO_3$ between lateral regions. Or, as suggested by Formula (1) above, the lateral region containing $PbZr_{0.6}Ti_{0.4}O_3$ can be viewed as a single compound in which Zr and Ti atoms occupy the B-sites as indicated by the formula, while the lateral region containing $PbZr_{0.7}Ti_{0.3}O_3$ can be viewed as another single compound. From this point of view, the functional gradient may be viewed as a compositional gradient of the concentration of Zr-atoms and Ti-atoms between lateral regions. The functional gradient may also be viewed as the change in concentration of one or several compounds between lateral regions. FGF thin films are characterized by unconventional hysteresis behavior. The remanent polarization and other electronic properties in a FGF thin film are different from the electronic properties of a homogeneous ferroelectric thin film, in which the chemical composition does not vary. Here, unconventional is used in the conventional sense in the ferroelectric art; that is, it means that the hysteresis curve shifts with the magnitude of the applied voltage and the direction of the shift depends on the orientation of the ferroelectric material. See, for example, Mark Brazier and M. McEltresh, "Unconventional hysteresis behavior in compositionallly graded Pb(Zr, Ti)O$_3$ thin films", Applied Physics Letters, Vol. 72, No. 9, 2 March 1998, which is hereby incorporated by reference as though fully disclosed herein.

The electronic properties of a FGF thin film according to the invention are useful for making an improved ferroelectric FET memory. The memory window of a ferroelectric FET containing a FGF thin film is larger than the memory window in a ferroelectric FET having a conventional ferroelectric thin film with a uniform composition. Before this invention, it was not known that FGM thin films, in general, and FGF thin films, in particular, provided improved and enlarged memory windows in ferroelectric FET devices. It is now also known that ferroelectric thin films having unconventional hysteresis behavior, as such behavior is described herein, generally improve ferroelectric FET performance by increasing the size of the memory window of a ferroelectric FET.

It should be understood that FIGS. 1–9, 11 and 12 depicting integrated circuit devices are not meant to be actual plan or cross-sectional views of any particular portion of an actual integrated circuit device. In the actual devices, the layers will not be as regular and the thicknesses may have different proportions. The figures instead show idealized representations which are employed only to more clearly and fully depict the structure and method of the invention than would otherwise be possible. In FIGS. 1–9, 11 and 12, for the sake of clarity, identical reference numerals are used to identify elements that are common among the depicted structures.

With respect to FIGS. 1–9, 11 and 12, the ferroelectric compounds are preferably layered superlattice material. Nevertheless, the ferroelectric material contained in the ferroelectric FGM thin film of the invention can include other metal oxides; for example, ABO$_3$-type perovskites. The ferroelectric material may also be a non-oxide metal compound, such as a metal fluoride, or a nonmetallic organic compound. The dielectric material in structures according to a first embodiment is typically a metal oxide, such as ZrO$_2$; but it may also be any dielectric material that is compatible with the other integrated circuit materials.

FIG. 1 shows a cross-sectional view of a portion of a ferroelectric FET memory cell 10 according to the invention. The FET ferroelectric memory cell 10 is formed on a wafer 11, comprising a standard semiconductor material 12, preferably a p-100 silicon substrate. A semiconductor substrate 19 comprises a highly doped source region 14 and a highly doped drain region 16, which are formed about a doped channel region 18. Doped source region 14, drain region 16 and channel region 18 are preferably n-type doped regions. A ferroelectric FGM thin film 26 is formed on semiconductor substrate 19 above channel region 18. Gate electrode 30 is located on ferroelectric FGM thin film 26. Semiconductor substrate 19, including source region 14, drain region 16, and channel region 18, ferroelectric FGM thin film 26 and gate electrode 30 together form ferroelectric FET memory cell 10. Typically, memory cell 10 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

In accordance with a first basic embodiment of the invention, ferroelectric FGM thin film 26 comprises a ferroelectric compound and a dielectric compound. The dielectric compound has a dielectric constant less than the dielectric constant of the ferroelectric compound. The presence of the dielectric compound in ferroelectric FGM thin film 26 lowers the overall dielectric constant of ferroelectric FGM thin film 26. Preferably, the ferroelectric compound is a ferroelectric metal oxide comprising a layered superlattice material, such as strontium bismuth tantalate, SrBi$_2$Ta$_2$O$_9$. In accordance with the invention, ferroelectric FGM thin film 26 has a plurality of lateral regions, each existing in a horizontal plane with respect to FIGS. 1–9,11 and 12. In FIG. 1, ferroelectric FGM thin film 26 has a first lateral region 27 and a second lateral region 28. The concentration of the ferroelectric compound is higher in first lateral region 27 than the concentration of the ferroelectric compound in second lateral region 28. Thus, there is a negative concentration gradient of the ferroelectric compound in the downwards vertical direction. The concentration of the ferroelectric compound in the first lateral region is higher than the concentration of the dielectric compound in the first lateral region. Conversely, the concentration of the dielectric compound is higher in the second lateral region than the concentration of the dielectric compound in the first lateral region. Thus, there is a positive concentration gradient of the dielectric compound in the downward vertical direction. The concentration of the dielectric compound in the second lateral region is higher than the concentration of the ferroelectric compound in the second lateral region. In FIG. 1, ferroelectric FGM thin film 26 has virtually pure ferroelectric compound in first lateral region 27 near gate electrode 30. The horizontal lines in the vicinity of second lateral region 28 are drawn more closely together as they approach semiconductor substrate 19, indicating that the chemical composition of the ferroelectric FGM thin film 26 corresponds more closely to the composition of the dielectric compound in the vertical direction towards substrate 19.

Figure 2:
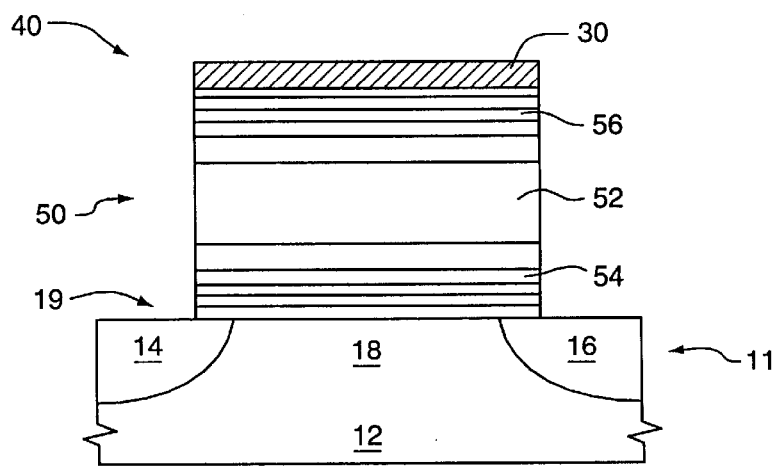
FIG. 2 shows a cross-sectional view of a portion of a ferroelectric FET memory according to the invention, in which the molar concentration gradient of the ferroelectric compound in the ferroelectric FGM thin film is positive from the bottom of the thin film in the upwards direction, and then becomes negative from the middle of the thin film going upwards.

FIG. 2 depicts a memory 40, similar to memory cell 10 of FIG. 1, except that ferroelectric FGM thin film 50 comprises lateral regions 52, 54 and 56, where first lateral region 52 has a higher concentration of the ferroelectric compound and is located towards the center of ferroelectric FGM thin film 50, and second lateral region 54 and third lateral region 56 contain higher concentrations of the dielectric compound than are present in first lateral region 52. Lateral regions 54 and 56 are located near semiconductor substrate 19 and gate electrode 30, respectively.

Figure 3:
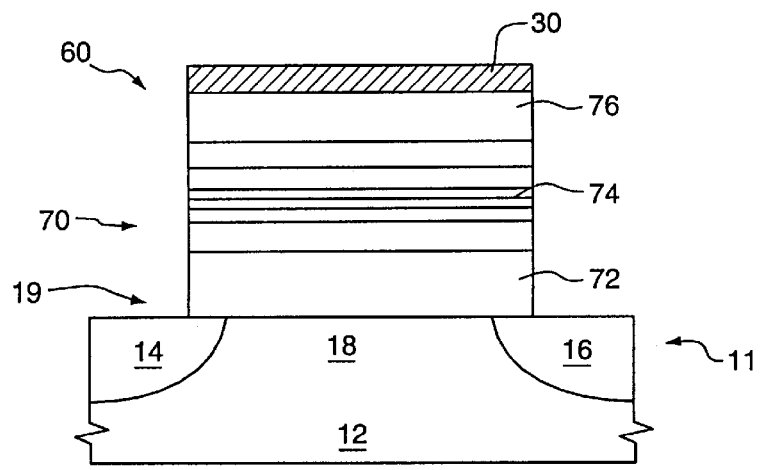
FIG. 3 shows a cross-sectional view of a portion of a ferroelectric FET memory according to the invention, in which the molar concentration gradient of the ferroelectric compound in the ferroelectric FGM thin film is negative from the bottom of the thin film in the upwards direction, and then becomes positive from the middle of the thin film in the upwards direction.

FIG. 3 depicts a ferroelectric FET memory 60 in which the ferroelectric FGM thin film 70 has a first lateral region 72 near semiconductor substrate 19, containing a high concentration of ferroelectric compound and low concentration of dielectric compound. The concentration of dielectric compound increases towards the middle of thin film 70, and is high in second lateral region 74. Towards the top of ferroelectric FGM thin film 70, in third lateral region 76 near gate electrode 30, the concentration of dielectric compound is low again, perhaps approaching zero.

Figure 4:
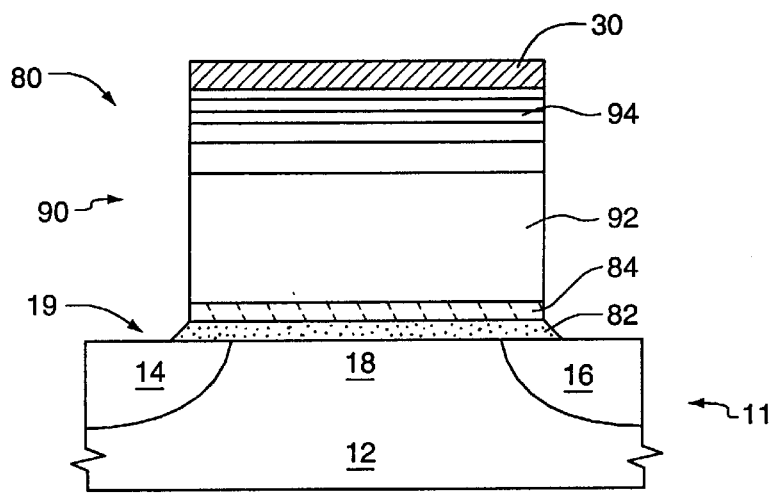
FIG. 4 depicts a MFIS-FET memory, in which a gate oxide layer is located on the semiconductor substrate, and an interface insulator layer is located on the gate oxide.

FIG. 4 depicts a MFIS-FET memory 80, in which a gate oxide 82 is located on semiconductor substrate 19. Although not shown in FIGS. 1–3, virtually all FET devices comprise a gate oxide at semiconductor substrate 19. The gate oxide is often formed by high-temperature process steps in the presence of oxygen. In FIG. 4, gate oxide 82 is silicon dioxide, resulting from oxidation of the silicon semiconductor substrate 19. A MFIS-FET memory 80 is a type of ferroelectric FET memory comprising an insulator layer 84 between semiconductor substrate 19 and ferroelectric FGM thin film 90. Typically, insulator layer 84 comprises CeO$_2$, ZrO$_2$, Y$_2$O$_3$ or Ce$_{1-x}$Zr$_x$O$_2$, where $0 \leq x \leq 1$, or another metal oxide. In FIG. 4, first lateral region 92 comprises a high concentration of the ferroelectric compound, while second lateral region 94 has a high concentration of the dielectric compound.

Figure 5:
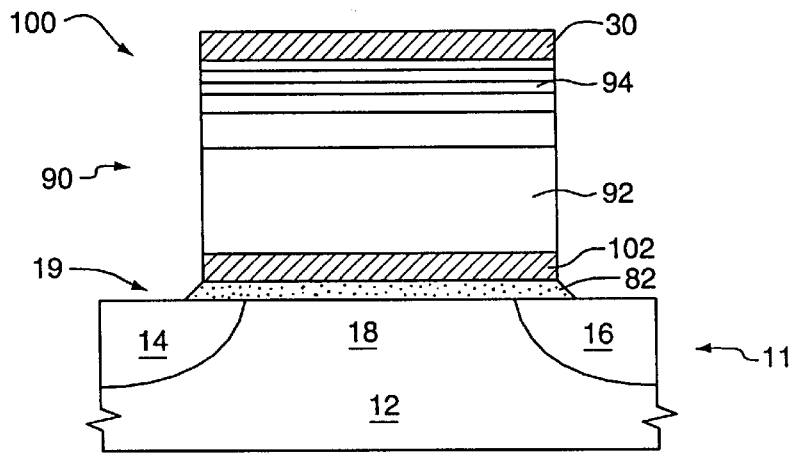
FIG. 5 depicts a metal-ferroelectric-metal-semiconductor ("MFMS") FET memory, in which a floating electrode is located on a gate oxide layer.
Figure 6:
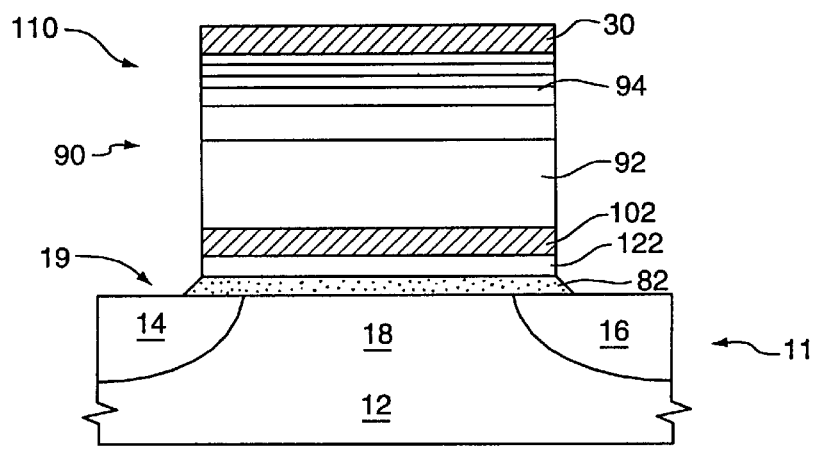
FIG. 6 is an embodiment similar to that in FIG. 5, except in FIG. 6 an adhesion layer is located on the gate oxide, under the floating electrode.

FIG. 5 depicts an embodiment of the invention in a metal-ferroelectric-metal-semiconductor ("MFMS") FET memory cell 100, in which a floating electrode 102 is located between semiconductor substrate 19 and ferroelectric FGM thin film 90. Floating electrode 102 typically comprises platinum. FIG. 6 is an embodiment similar to that in FIG. 5, except in FIG. 6 an adhesion layer 122, typically comprising titanum and titanium oxide, is located on gate oxide 82, under floating electrode 102.

Figure 7:
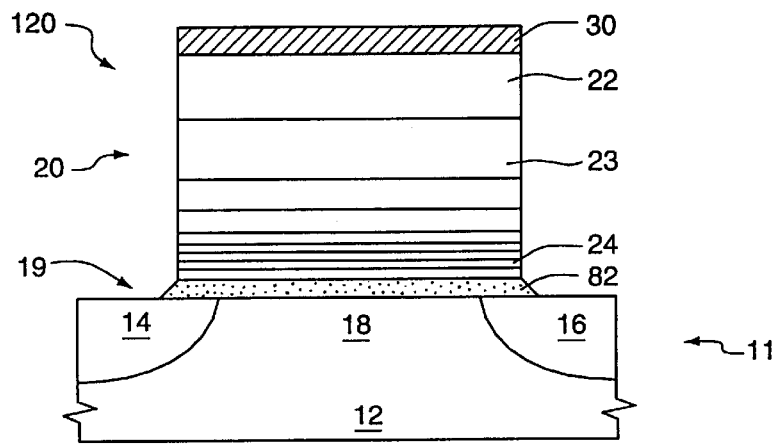
FIG. 7 depicts a MFS-FET memory in which the ferroelectric FGM thin film is located directly on a gate oxide of the semiconductor substrate, and in which the molar concentration gradient of the ferroelectric compound is negative in the downwards direction from the top of the thin film.

FIG. 7 depicts a MFS-FET memory 120 that is a preferred embodiment of the invention because ferroelectric FGM thin film 20 is located directly on gate oxide 82 of semiconductor substrate 19. The second lateral region 24 containing a high molar percentage of dielectric compound is located towards the bottom of ferroelectric FGM thin film 20. As a result, a high concentration of the dielectric compound, perhaps even pure dielectric compound, is present near the interface of ferroelectric FGM thin film 20 with semiconductor substrate 19. The dielectric compound is typically a compound like $ZrO_2$, $CeO_2$, $Y_2O_3$, or $Ce_{1-x}Zr_xO_2$, where $0 \leq x \leq 1$; preferably $ZrO_2$. The high concentration of dielectric compound functions, therefore, like an insulator layer in MFIS-FETs of the prior art, and as depicted in the embodiment of FIG. 4. For example, the high concentration of the dielectric compound helps to eliminate the interface problems that arise at an interface of ferroelectric oxides and silicon substrate. The concentration of the dielectric compound has a negative gradient in the upwards direction towards gate electrode 30; thus, it decreases in the upwards vertical direction. The concentration of the ferroelectric compound has a positive gradient in the upwards direction towards gate electrode 30, thus increasing in the upwards vertical direction as the concentration of the dielectric compound decreases. The chemical composition of lateral region 23 corresponds to a mixture of significant amounts of the precursors of both the ferroelectric compound and the dielectric compound. In the first lateral region 22, the concentration of the ferroelectric compound is high, perhaps being pure near gate electrode 30. In accordance with the invention, the dielectric compound has a lower dielectric constant than the ferroelectric compound. As a result, the overall dielectric constant of the entire ferroelectric FGM thin film 20 is lower than if the thin film were to comprise only the ferroelectric compound. The resulting lower dielectric constant of ferroelectric FGM thin film 20 means that the voltage drop across ferroelectric FGM thin film is greater, corresponding to the lower dielectric constant, for a given write voltage applied to gate electrode 30. The greater voltage drop means there is a correspondingly stronger electric field in the ferroelectric FGM thin film to switch the ferroelectric polarization of ferroelectric FGM thin film 20. The ferroelectric compound is preferably a layered superlattice material, such as strontium bismuth tantalate, $SrBi_2Ta_2O_9$.

Figure 8:
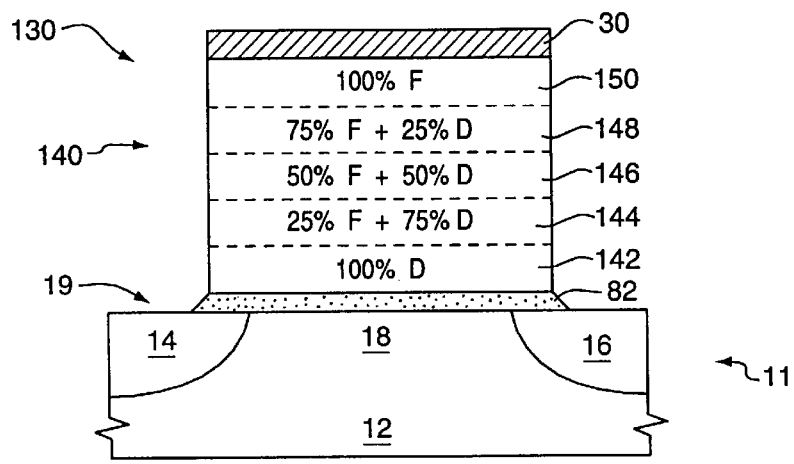
FIG. 8 depicts a MFS-FET memory in which the ferroelectric FGM thin film is located directly on a gate oxide of the semiconductor substrate and has five lateral regions, in which the molar concentration gradient of a ferroelectric compound is negative in the downwards direction between lateral regions from the top of the thin film, and the concentration gradient of a dielectric compound is positive in the downwards direction.
Figure 9:
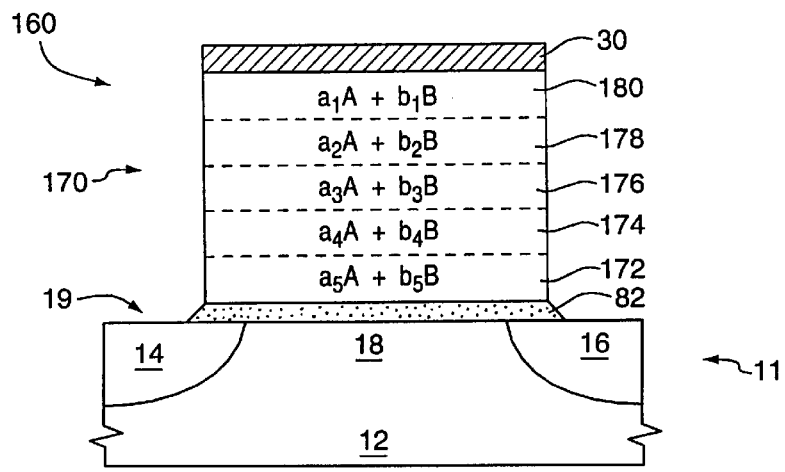
FIG. 9 depicts a MFS-FET memory in which the ferroelectric FGM thin film is a FGF thin film and is located directly on a gate oxide of the semiconductor substrate and has five lateral regions, in which there are molar concentration gradients of two types of metals between lateral regions.

Although FIGS. 1–7 were discussed in terms of two or three lateral regions, it is understood that ferroelectric FGM thin films 26, 50, 90, 26 depicted in FIGS. 1–7 may contain a large number of lateral regions. In FIGS. 1–7, the functional concentration gradients are preferably gradual. In a limiting case of gradual concentration gradient, the vertical thickness of each lateral region is infinitesimally small. The functional gradient may also be stepped, instead of gradual. When it is stepped, there is a finite number of lateral regions. FIG. 8 depicts a ferroelectric FET 130 in which FGM thin film 140 has five distinct lateral regions, each lateral region having a chemical composition corresponding to the stoichiometric formula for a ferroelectric compound, a dielectric compound, or a mixture of the ferroelectric and dielectric compounds. In FIG. 8, lateral region 150 is 100% ferroelectric compound ("F"). In succeeding lateral regions 148, 146, 144, 142, in the downward direction, the molar concentration of F is stepped down in 25% steps, and the molar concentration of the dielectric compound ("D") is stepped up. FIG. 9 depicts a ferroelectric FET 160 in which FGM thin film 170 has five distinct lateral regions, each lateral region having a chemical composition corresponding to the stoichiometric formula for a plurality of ferroelectric compounds, or in an alternative view, to the stoichiometric formula of a single compound in which certain crystal lattice sites throughout the lateral region may be occupied by one of a plurality of suitable metal atoms. In FIG. 9, for example, "A" and "B" represent two different types of elements that are capable of occupying the same type of site in a crystal lattice. For example, in PZT, Zr and Ti are two types of elements that may occupy the B-site in an $ABO_3$-type perovskite crystal lattice. In FIG. 9, in which the relative concentrations of elements A and B vary between the layers, the coefficients $a_i$ and $b_i$ represent the relative mole percent concentration of compounds A and B, or elements A and B, respectively. In each lateral region, the sum of $a_i$ and $b_i$ typically equals one. In order for thin film 170 to be a FGF, the values of $a_i$ and $b_i$ cannot be identical in all lateral regions. Typically, the values of $a_i$ increase in one vertical direction, and the values of $b_i$ increase in the opposite vertical direction.

Although FIGS. 1–8 were described in terms relating to a first basic embodiment of the invention, in which the FGM thin film contains functional gradients of a ferroelectric and dielectric compounds, the description of functional gradients applies generally to all FGM thin films, including FGF thin films of the second basic embodiment of the invention. Therefore, the depiction in FIGS. 1–8 and description of the spatial placement of lateral regions and the direction and rate of change of concentration gradients applies also to the ferroelectric compounds of FGF thin films.

Figure 10:
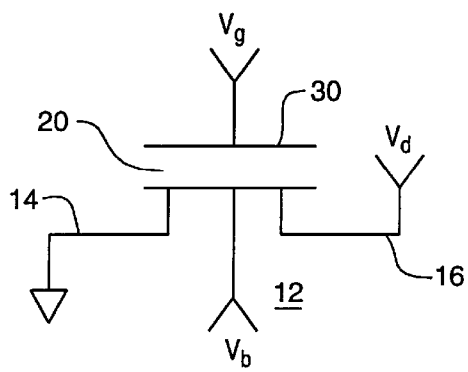
FIG. 10 shows the equivalent circuit for the ferroelectric FET memory of FIG.

FIG. 10 shows the equivalent circuit for the preferred memory cell 120 of FIG. 7. The circuit diagrams of the memory cells depicted in FIGS. 1–9 are electrically equivalent to the circuit of FIG. 10. In the preferred embodiment, source 14 is held at ground, and a bias voltage, Vb, used to select and deselect the cell is applied to substrate 19. A drain bias voltage, Vd, is applied to drain 16 in the read process, and a gate bias voltage, Vg, is applied to gate 30 to write to the cell.

Figure 11:
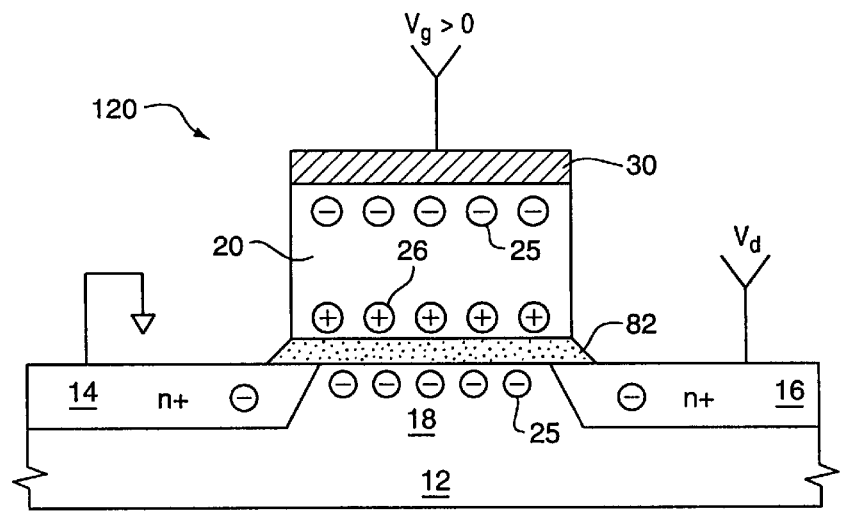
FIG. 11 illustrates the state of polarization in FIG. 7 of the ferroelectric thin film and the resulting electronic state of the gate region for an arbitrarily selected binary "1" state.
Figure 12:
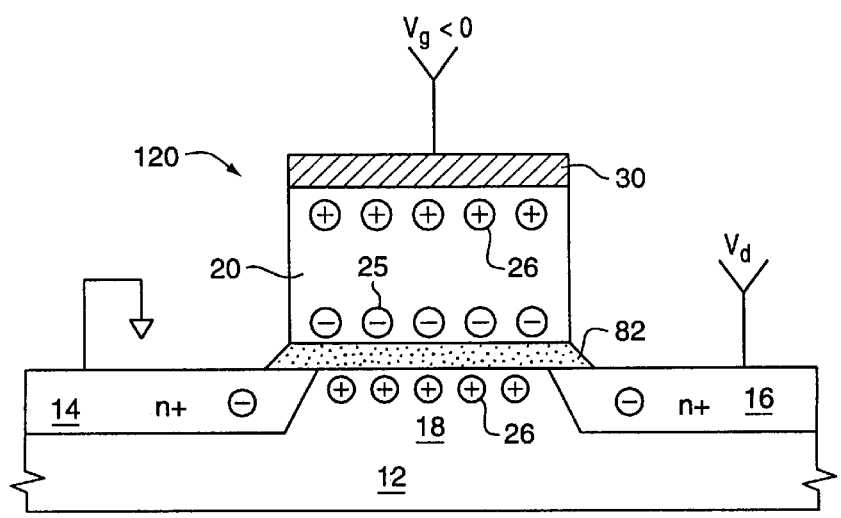
FIG. 12 illustrates the state of polarization in FIG. 7 of the ferroelectric thin film and the resulting electronic state of the gate region for the "0" state.

FIG. 11 illustrates the state of polarization of the ferroelectric FGM thin film 20 and the resulting electronic state of channel region 18 for an arbitrarily selected binary "1" state, while FIG. 12 illustrates the state of polarization of the ferroelectric FGM thin film 20 and the resulting state of channel region 18 for the "0" state. For the sake of clarity, insulating layers are not shown in these figures. In these figures, the circles with minus signs, such as 25, represent electrons; the circles with plus signs, such as 26, represent positive holes. As shown in FIG. 11, if a positive write bias voltage, Vg, is applied to gate 30, then the resulting electric field exerted on ferroelectric FGM thin film 20 causes the ferroelectric metal oxide of thin film 20 to be polarized as shown, even after the voltage and field are no longer applied. The polarization in ferroelectric FGM thin film 20 is transferred through gate oxide 82 to channel region 18, attracting electrons into channel region 18, and thereby causing an increase of free electrons available for conduction of electric current. As a result, when drain voltage, Vd, is applied to drain region 16 in a read operation, a current sensor senses high current across channel region 18, and reads a binary "1" state. When, as depicted in FIG. 12, a negative Vg is applied in the write operation, then the resulting polarization in thin film 20 repels current-carrying electrons or attracts positive holes from channel region 18, and the resulting low current is sensed as the binary "0" state when Vd is applied in a read operation. The write bias voltage, Vg, and the read bias voltage, Vd, are typically in the range of 3–5 volts.

2. The Fabrication Process

The word "substrate" is often used ambiguously in the art. It can mean the underlying wafer 11 on which an integrated circuit is formed as well as any object on which a thin film layer is deposited. In this disclosure, "substrate" shall mean the object to which the layer of interest is applied; for example, when we are talking about a ferroelectric FGM thin film, such as thin film 90 in FIG. 6, the substrate includes elements 12,14, 16, 18, 82, 122 and 102 on which the ferroelectric thin film is formed. The term "semiconductor substrate" is more specific than substrate. As used herein, "semiconductor substrate 19" refers to those elements of the circuit having origins in the original semiconductor material of the starting wafer, such as from the p-100 crystalline silicon material of FIG. 7. Thus, in the example of the structure of FIG. 7, "semiconductor substrate 19" includes elements 12,14,16,18 and 82.

The term "thin film" is used herein as it is used in the integrated circuit art. Generally, it means a film of less than a micron in thickness. The thin films disclosed herein are in all instances less than 0.5 micron in thickness. Preferably, ferroelectric FGM thin film 124 is 40 nm to 200 nm thick. These thin films of the integrated circuit art should not be confused with the layered capacitors of the macroscopic capacitor art which are formed by a wholly different process that is incompatible with the integrated circuit art.

In the art, the word "precursor" can mean a solution containing one metal which is mixed with other "precursors" to form intermediate precursors or final precursors, or it may refer to a final precursor mixture, that is, the solution to be applied to the substrate. In this disclosure, the first type of precursor is usually designated specifically; for example, a "strontium precursor", "the SBT precursor", "the precursor of the ferroelectric compound" and the "dielectric precursor". The precursor as applied to the substrate is usually referred to as a "final precursor", "precursor mixture", or similar term. In any case, the meaning is usually clear from the context.

The term "stoichiometric" herein may be applied to both a solid film of a material or to the precursor for forming a material. When it is applied to a solid thin film, it refers to a formula which shows the actual relative amounts of each element in a final solid thin film. When applied to a precursor, it indicates the molar proportion of metals in the precursor. A balanced stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2Ta_2O_9$ are balanced stoichiometric formulae. In contrast, a precursor for strontium bismuth tantalate in which the molar proportions of strontium, bismuth, and tantalum are 0.9,2.18, and 2.0, respectively, is represented herein by the unbalanced stoichiometric formula $Sr_{0.9}Bi_{2.18}Ta_2O_9$, since it contains excess bismuth and deficient strontium relative to the B-site element tantalum. In this disclosure, an excess amount of a metallic element means an amount greater than required to bond with the other metals present to make a completed crystalline structure of the desired material, with all atomic sites occupied and no amount of any metal left over. A deficient amount of a metallic element means an amount less than required to bond with the other metals if the other metals were present in stoichiometrically balanced amounts.

Terms of orientation herein, such as "upward", "downward", "above", "top", "upper", "below", "bottom" and "lower", mean relative to semiconductor substrate 19. That is, if a second element is "above" a first element, it means it is farther from substrate 19, and if it is "below" another element then it is closer to semiconductor substrate 19 than the other element. A material gradient that is negative in the upward direction means that the lateral region or regions farther from the semiconductor substrate 19 have less of the material. Terms such as "above" and "below" do not, by themselves, signify direct contact. But terms such as "on" or "onto" do signify direct contact of one layer with an underlying layer.

The long dimension of semiconductor substrate 19 defines a plane that is considered to be a "horizontal" plane herein, and directions perpendicular to this plane are considered to be "vertical". The terms "lateral" or "laterally" refer to the direction of the flat plane of the thin film, that is, parallel to the horizontal direction.

Figure 13:
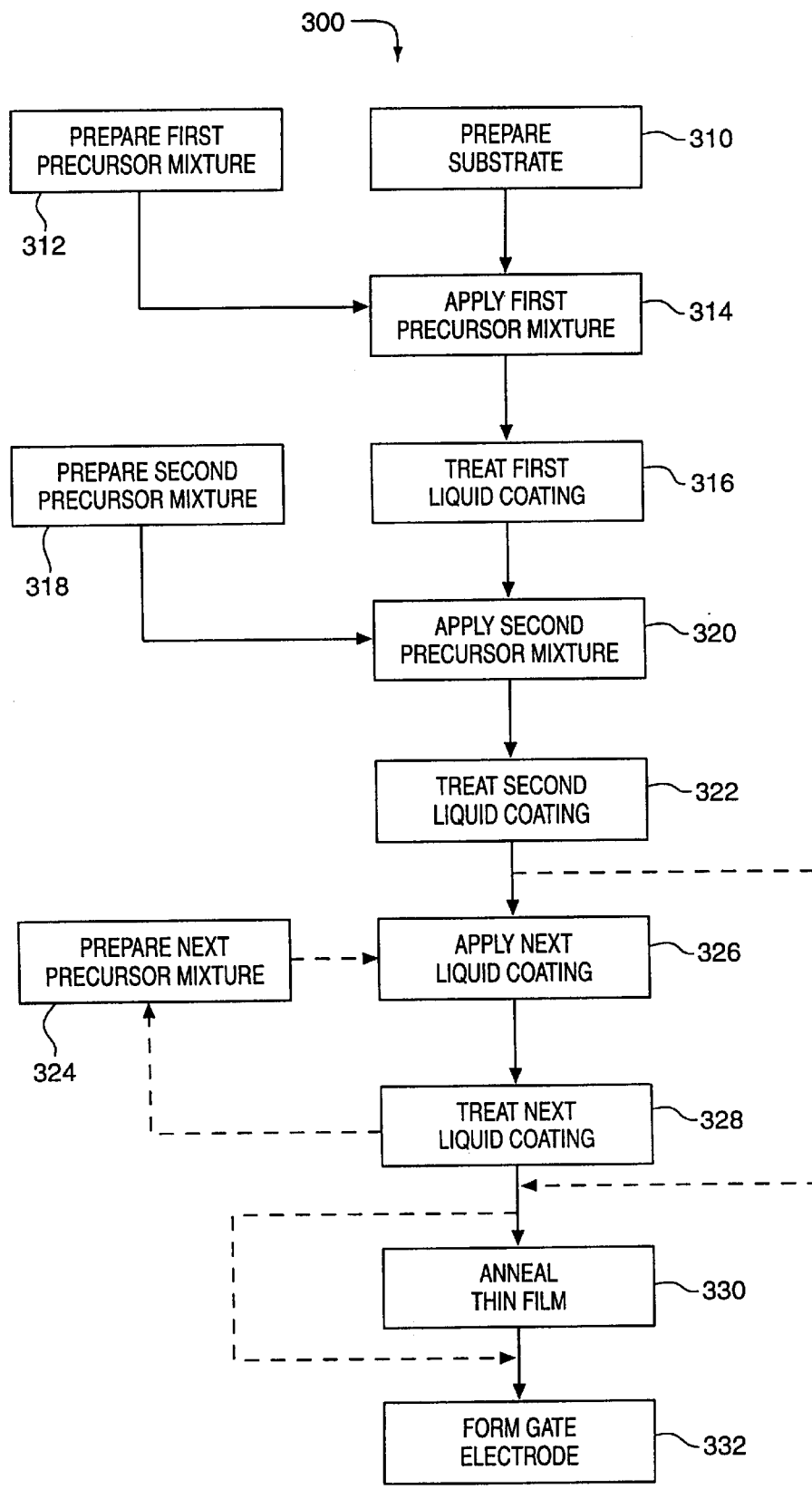
FIG. 13 is a flow chart showing the steps of a generalized liquid source deposition process for fabricating a ferroelectric FET memory.

FIG. 13 is a flow chart showing the steps of a generalized liquid source deposition process 300 for fabricating memory cell 10, 40, 60, 80,100, 110, 120, 130, 160 of FIGS. 1, 2, 3, 4, 5, 6, 7, 8 and 9, respectively, as well as other variations of embodiments of the invention. Ferroelectric memory cell 120 depicted in FIG. 7 is a preferred embodiment of the invention, so the fabrication methods disclosed here are discussed in relation to the structure of memory 120. It is understood, however, that the useful feature of a functional gradient of a dielectric compound in a ferroelectric thin film can be applied in many variations of the basic structures disclosed herein, and can be fabricated by variations of the generalized fabrication methods disclosed herein.

In step 310, wafer 11 is cleaned to remove contaminants, preferably by dipping the wafer into $H_2SO_4$ for 30 minutes. Then the wafer is dipped into 10:1 BOE for five minutes, which removes any natural oxide that may have formed on the wafer. A field oxide 82 is grown in a furnace, preferably to a thickness of 500 nanometers (nm). Source/drain regions 14 and 16 and channel region 18 are then formed by a conventional doping method. This includes the usual photo resist, etching and strip steps for removal of the field oxide followed preferably by a phosphorous diffusion step. Preferably, the doping of channel region 18 is in the range of $2 \times 10^{15}$ to $10^{17}$ atoms/cm$^3$, and most preferably in the range of $10^{16}$ to $10^{17}$ atoms/cm$^3$, which provides a resistance of about 1 ohm to 5 ohms. Preferably, the doping of the source/drain regions is in the range of $10^{19}$ to $10^{20}$ atoms/cm$^3$.

In step 312, a first precursor mixture of the ferroelectric FGM thin film is prepared from initial precursors of the various components of the ferroelectric compound and the dielectric compound. The ferroelectric compound is typically a complex metal oxide and preferably a layered superlattice material; for example, strontium bismuth tantalate having a stoichiometric formula $SrBi_2Ta_2O_9$. The dielectric compound is typically a simple metal oxide, preferably $ZrO_2$. Preferably, the metal oxides are formed using a so-called metal organic deposition ("MOD") method. The individual MOD precursors are formed by interacting each of the metals, for example, zirconium for the dielectric compound, and strontium, bismuth and tantalum for the ferroelectric compound, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution.

In using MOD techniques to deposit metal oxide thin films, it is common to include excess amounts of precursor compounds for certain metal constituents that volatilize easily. For example, when forming PZT, it is common to include up to about 10% excess lead in the liquid precursor. Similarly, when forming layered superlattice materials containing bismuth, it is common to include up to about 9% to 10% excess bismuth.

In the preferred embodiment, a layered superlattice material, such as described in U.S. Pat. No. 5,519,234 issued May 21, 1996 to Carlos A. Paz de Araujo et al., and U.S. Pat. No. 5,434,102 issued on Jul. 18, 1995 to Watanabe et al., is used. In the experimental examples discussed below, the layered superlattice material strontium bismuth tantalate having the final formula $SrBi_2Ta_2O_9$ was used. Electrode 56 is preferably platinum, but may be other metals or conductors also.

In step 314 of method 300 of FIG. 13, a coating of the first final liquid precursor mixture is applied to the substrate. The first precursor mixture is a mixture containing a defined concentration of ferroelectric compound and dielectric compound, one of which may be zero. In method 300, a spin-coating method is contemplated. Preferably, a spincoat of first precursor mixture is deposited on the substrate at 1500 rpm for 30 seconds to form a liquid coating. In step 318, the first liquid coating is treated. The step of treating may comprise a process selected from the group including: exposing to vacuum, exposing to ultraviolet radiation, drying, heating, baking, rapid thermal processing, and annealing. Treatment in step 316 typically includes drying, rapid thermal processing ("RTP"), and annealing. Drying is typically performed for one minute at 160° C., then at 260° C. for four minutes. The RTP is typically done at 725° C. for 30 seconds, with a 100° C./sec. ramping rate. A furnace anneal, preferably in an oxygen atmosphere at 800° C. for 60 minutes, crystallizes the ferroelectric and dielectric compounds in lateral region 24. In step 318, a second precursor mixture for the second liquid coating to form another lateral region is prepared. The second precursor mixture is applied in step 320. The liquid coating formed in step 320 is treated in step 322, similarly to the treatment in step 316. If additional lateral regions are to be formed in ferroelectric FGM thin film 20, then additional final precursor mixtures are prepared, applied and treated in steps 324,326 and 328. When all of the liquid coating has been applied and treated, a final anneal may be performed in step 330; for example, for 60 minutes at 800° C. Ferroelectric FGM thin film 20 resulting from steps 310–330 comprises a plurality of lateral regions having concentration gradients of the ferroelectric and dielectric compounds in the vertical direction. These steps result in a ferroelectric FGM thin film 20 having a thickness in the range 40 to 400 nm, preferably in the range 80–200 nm. Finally, in step 332, a gate electrode 30 is formed. Preferably, the gate electrode comprises platinum that is sputter-deposited to make a layer with a 200 nm thickness.

Figure 14:
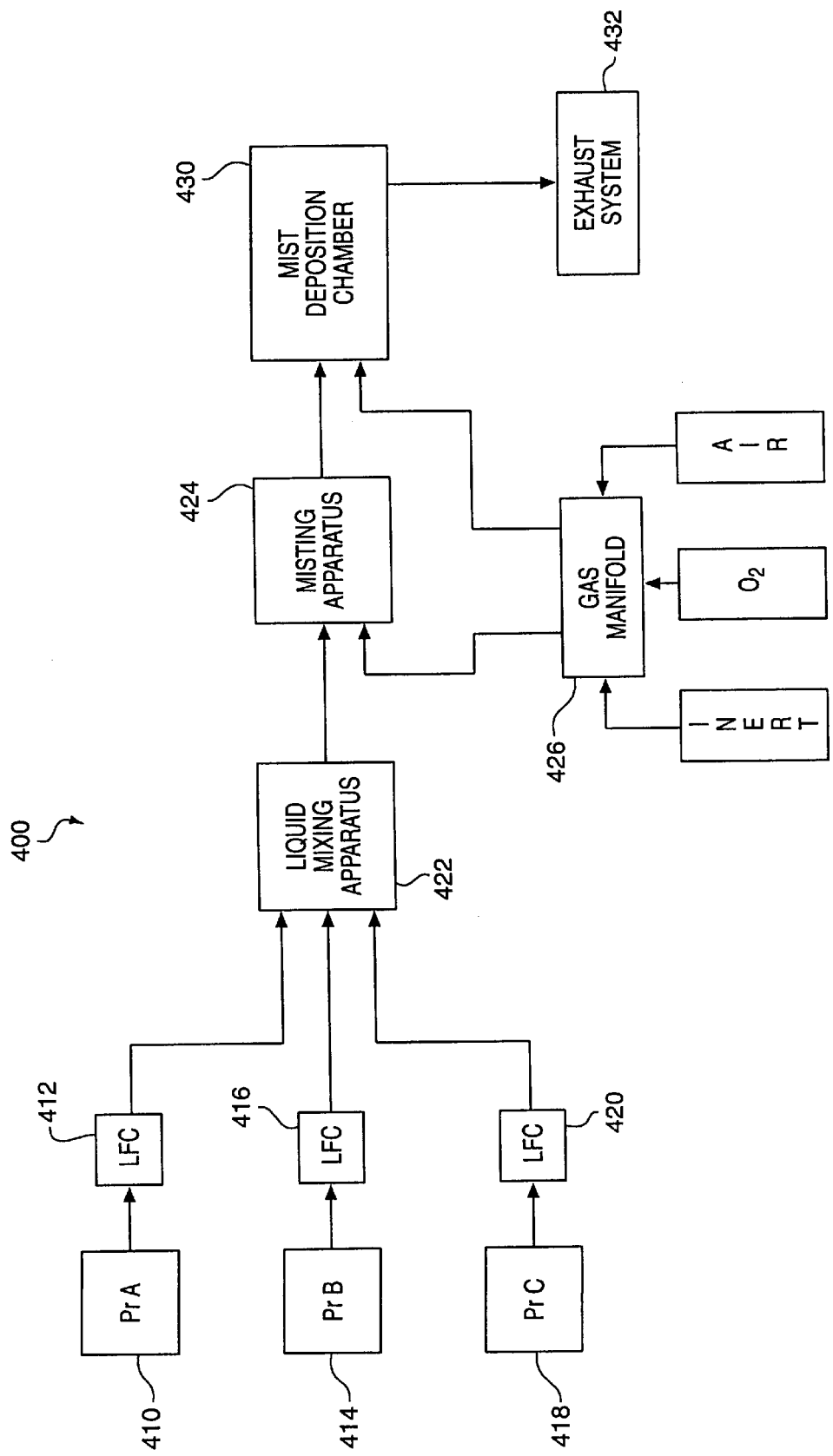
FIG. 14 shows a diagram of a generalized misted deposition apparatus for fabricating a ferroelectric FGM thin film in a ferroelectric FET of the invention.

A misted deposition method is more efficient and flexible than a multicoat spin-on method because the composition of the precursor mixture solution used to form a mist and thereby a liquid coating on the substrate can be simply varied by varying the mass flow rates of standardized liquid initial precursors into the misting apparatus. A diagram of a generalized misted deposition apparatus is shown in FIG. 14. Sources of initial precursors PrA, PrB and PrC have reference numerals 410, 414 and 418, respectively. Associated with each precursor source is a liquid flow controller. For example, PrA can be a liquid precursor containing strontium and tantalum initial precursors; PrB can be a precursor for bismuth; and PrC can be a precursor of zirconium oxide, $ZrO_2$. Gradients of the ferroelectric and dielectric compounds can be formed in the final ferroelectric FGM thin film 20 by varying the relative mass flow rates from sources 410, 414 and 418 through liquid flow controllers 412, 416 and 420, respectively, into liquid mixing apparatus 422. The respective liquid flow rates can be varied continuously and gradually to produce gradual concentration gradients of compounds in ferroelectric FGM thin film 20. Or the flow rates can be varied in discrete steps, to produce steps in the concentration gradients. The mixed liquid stream flows from liquid mixing apparatus 422 into misting apparatus 424. A gas or a mixture of gases for forming a mist also enters misting apparatus 424. The mist carrier gas may be a pure inert gas, such as argon, or it may contain some reactive gas, like oxygen. The misting apparatus may use one or several conventional means for creating mists, including ultrasound and venturi misting processes. The mist flows into mist deposition chamber 430, where the substrate is located. The mist forms a liquid coating on the substrate. The composition of the liquid coating varies in the vertical direction as the composition of the mist is varied. When the liquid coating has the desired thickness, the liquid coating is treated to form ferroelectric FGM thin film 20. The step of treating may comprise a process selected from the group including: exposing to vacuum, exposing to ultraviolet radiation, drying, heating, baking, rapid thermal processing, and annealing. The remaining mist and carrier gas is removed via exhaust system 432.

Figure 15:
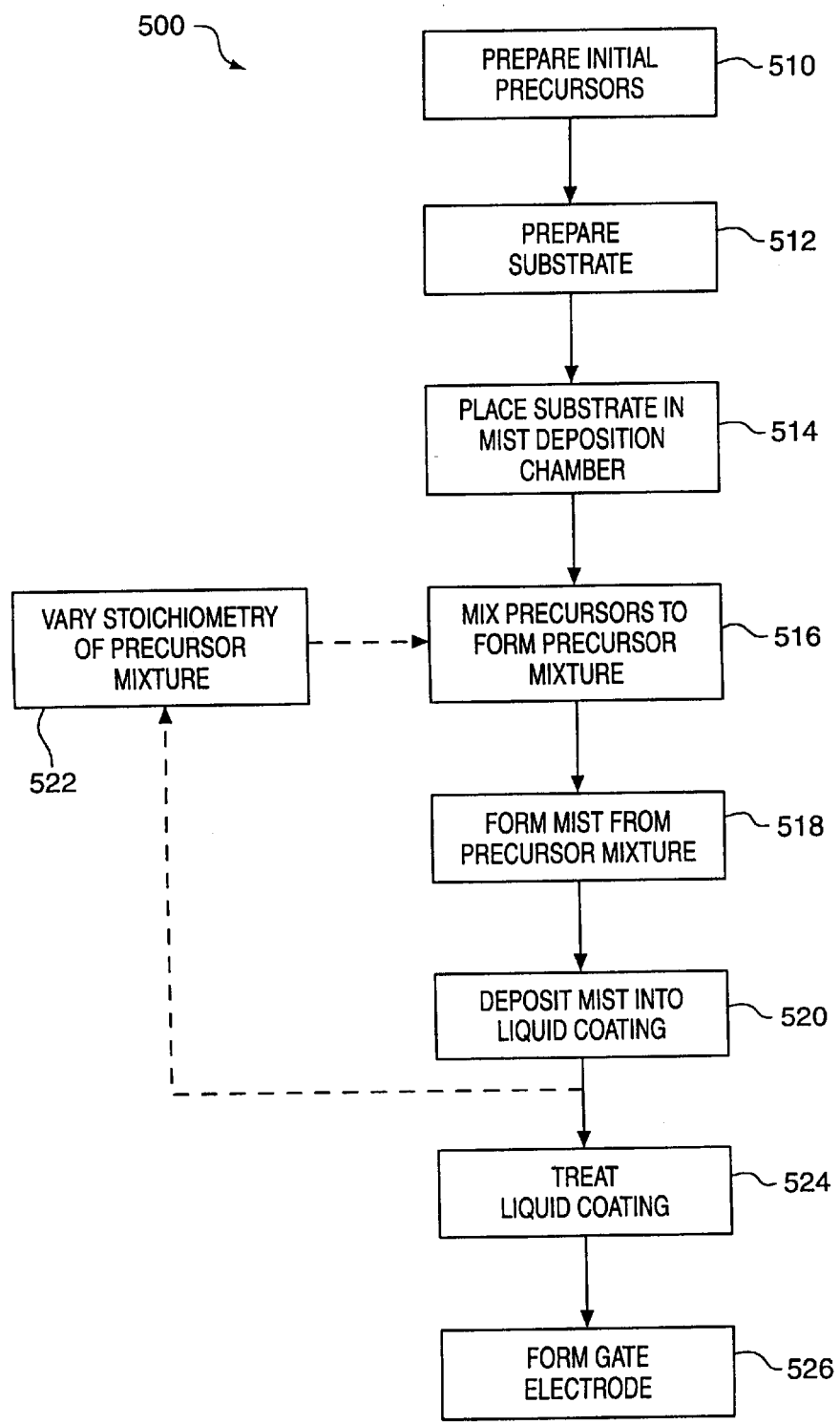
FIG. 15 is a process flow sheet for a generalized misted deposition process for forming a ferroelectric FET with a ferroelectric FGM thin film in accordance with the invention.

FIG. 15 is a process flow sheet for a generalized misted deposition process 500 to form a ferroelectric FGM thin film having a functional concentration gradient in accordance with the invention. Initial precursors, preferably MOD precursors, are prepared in step 510. A substrate as described with respect to FIG. 13 is prepared in step 512 and placed in misted deposition chamber 430 in step 514. The mass flow rates of initial precursors for forming the ferroelectric compound and the dielectric compound of ferroelectric FGM thin film 20 are controlled by liquid flow controllers, and the initial precursors are mixed in step 516 to form a precursor mixture. A mist of the precursor mixture is formed in step 518, and the mist is flowed into a liquid deposition reactor in step 520 where it forms a liquid coating on the substrate. During the course of liquid deposition in step 520, the stoichiometry of the precursor mixture is varied in step 522. As a result, the composition of the deposited liquid coating varies vertically, resulting in formation of concentration gradients of the ferroelectric and dielectric compounds in ferroelectric FGM thin film 20 after treatment of the liquid coating in step 524. The step of treating may comprise a process selected from the group including: exposing to vacuum, exposing to ultraviolet radiation, drying, heating, baking, rapid thermal processing, and annealing. The memory structure is completed in step 526 by depositing a gate electrode on ferroelectric thin film 20.

Figure 16:
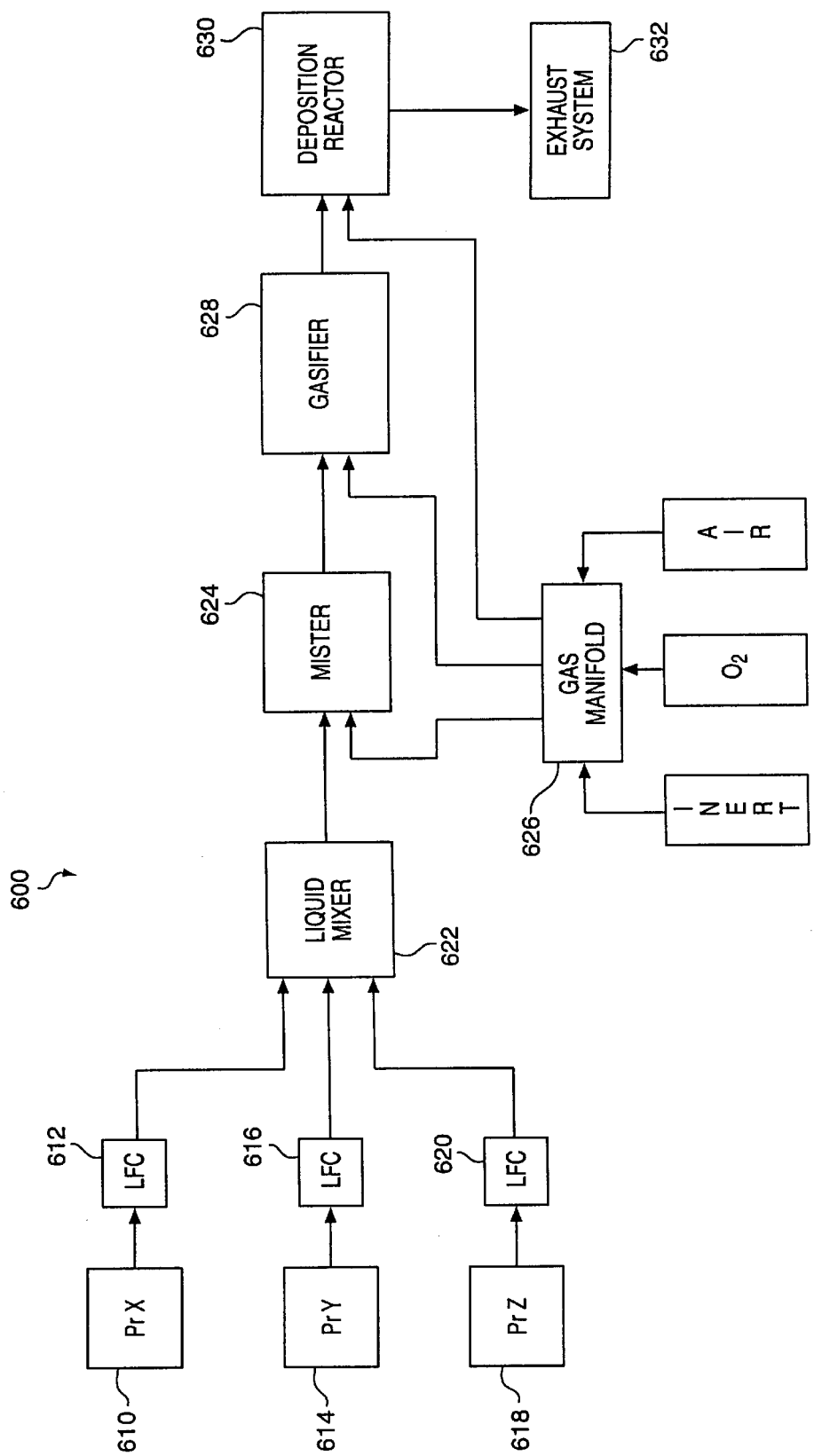
FIG. 16 is a diagram of a generalized CVD apparatus for forming a ferroelectric FGM thin film in a ferroelectric FET according to the invention.
Figure 17:
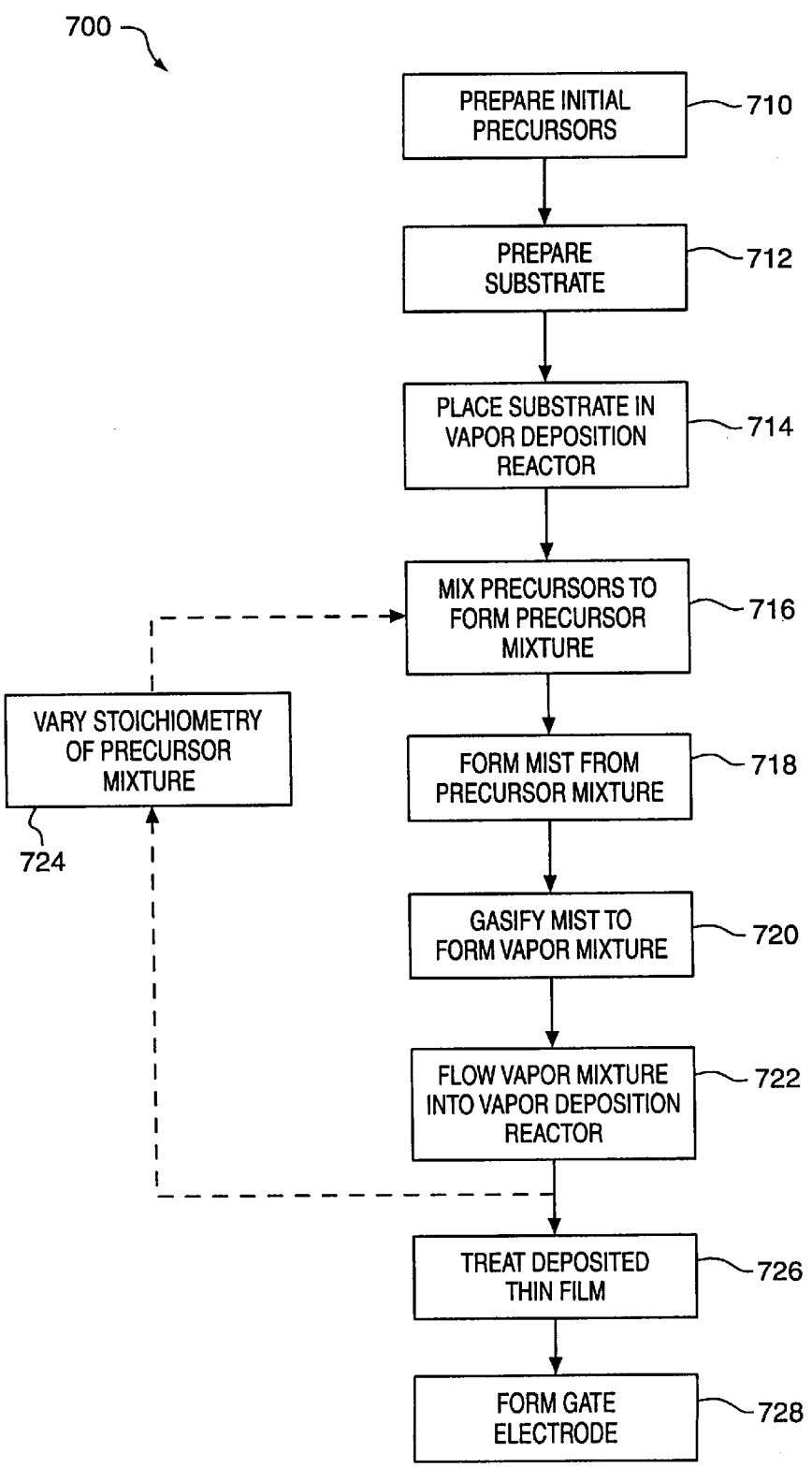
FIG. 17 is a process flow sheet for a generalized CVD process for forming a ferroelectric FET with a ferroelectric FGM thin film in accordance with the invention.

The preferred method for forming a ferroelectric FGM thin film 20 having functional compositional gradients in accordance with the invention is a chemical vapor deposition ("CVD") method. A diagram of a generalized preferred multisource CVD apparatus for forming a ferroelectric FGM thin film according to the invention is shown in FIG. 16. A preferred multisource CVD method 700 for forming a ferroelectric FGM thin film according to the invention is shown in FIG. 17, and it will be explained with reference to FIG. 16. In step 710, initial precursors, preferably MOD precursors, are prepared and placed in sources 610, 614 and 618. In step 712, the substrate is prepared as described with reference to step 310 of FIG. 13, and placed in the CVD reactor in step 714. Mass flow rates of the precursors into a liquid mixer 622 are controlled by liquid flow controllers 612, 616, and 620 so that the precursors can be mixed to form a precursor mixture in step 716. In step 718, the mixed final precursor liquid is preferably fed into a mister 624, which creates a mist using any suitable misting means, including ultrasound and venturi misting. A carrier gas for creating and carrying the mist is controlled by gas manifold 626. The mist stream flows into a gasifier 628, where the liquid mist particles are gasified in step 720, forming a first vapor mixture without causing significant premature reaction. Premature reaction can be avoided: by using inert carrier gas; by forming small particle sizes (in the 0.5–5 micron range), which have a large surface to volume ratio; by keeping short residence times; and by using low gasification temperatures (less than 200° C.). In step 722, the first vapor mixture from the first gasified precursor stream is fed into vapor deposition reactor 630, where it is mixed with oxygen reactant gas and reacts at the heated substrate to form a solid film of material. In step 724, the mass flow rates of initial precursors to liquid mixer 622 are varied to change the composition of the mist stream and, thereby, of the second vapor mixture going into the CVD reactor. The mass flow rates of the liquid precursors may be varied again, either gradually or step-wise, to change the composition of the inlet vapor mixture. As a result, the solid film deposited on the substrate has composition gradients corresponding to the varied composition of the inlet gasified precursor. In step 726, the deposited solid film is treated to form ferroelectric FGM thin film 30. The step of treating may comprise a process selected from the group including: exposing to vacuum, exposing to ultraviolet radiation, heating, baking, rapid thermal processing, and annealing. In step 728, a gate electrode 30 is formed on ferroelectric FGM thin film 20.

Although the fabrication methods described with reference to FIGS. 13–17 were discussed in terms of the first basic embodiment of the invention, in which a FGM thin film comprises both ferroelectric and dielectric material, the inventive methods are equally applicable for the fabrication of FGF thin films. The FGF thin films of the invention can be fabricated using similar types of MOD precursor compounds.

EXAMPLE 1

Ferroelectric FGM thin films according to the invention, as well as non-FGM composite thin films, were deposited on platinum electrodes overlying silicon substrates. Crystallographic x-ray studies were performed to determine the structure of the deposited thin films. Then top electrodes were deposited on the thin films to form capacitors. Electronic measurements were performed on the capacitors to study ferroelectric characteristics.

Ferroelectric FGM thin films of functionally gradient material and non-FGM thin films with various composite compositions, as depicted in FIGS. 18–25, were formed on semiconductor wafer 810, having a silicon semiconductor substrate 812, a silicon dioxide layer 814, a titanium oxide adhesion layer 816, and a Pt bottom electrode 818. A 0.2M MOD precursor solution for the ferroelectric compound strontium bismuth tantalate ("SBT") was prepared for use. SBT is a layered superlattice material. The MOD precursor comprised strontium 2-ethylhexanoate, bismuth 2-ethylhexanoate, and tantalum 2-ethylhexanoate in an n-octane-based solvent and in relative molar proportions corresponding to the stoichiometrically unbalanced formula $SrBi_{2.2}Ta_2O_9$. A 0.2M MOD precursor solution for the dielectric compound $ZrO_2$ was also prepared. The $ZrO_2$ precursor comprised zirconium 2-ethylhexanoate in n-octane solvent. The liquid precursors were applied by spin-on coating. Just prior to coating, all solutions were diluted to 0.1M by adding n-butyl-acetate. Each lateral region of ferroelectric FGM thin films depicted in FIGS. 18–25 was formed by applying a liquid coating and treating it prior to applying the next liquid coating. Lateral regions comprising both SBT and $ZrO_2$ were formed by making a precursor mixture solution of the SBT precursor and $ZrO_2$ precursor.

To form the thin films depicted in FIGS. 18–25, a series of p-type 100 Si wafers 810 were oxidized to form silicon dioxide layer 814. An adhesion layer consisting substantially of titanium having a thickness of about 50 nm was deposited on the substrate; oxidation during subsequent high-temperature treatment resulted in titanium oxide layer 816. Platinum bottom electrode 818 having a thickness of 300 nm was formed on adhesion layer 816. Next, the wafers were dehydrated for 30 minutes at 180° C. in low vacuum.

Table 1 lists the precursor compositions and coating sequence of the experimental thin films. The composition of each precursor mixture solution for each liquid spin-coating in sequence is indicated by a letter, A through F, which is described in the key beneath the table.

TABLE 1

| Sample No. | FIG. No. | Spin-On RPM | Precursor Composition Spin-Coat No. | | | | | |
|---|---|---|---|---|---|---|---|---|
| | | | 1 | 2 | 3 | 4 | 5 | 6 |
| 1 | 18 | 1500 | A | B | C | D | E | F |
| 2 | 19 | 1500 | F | E | D | C | B | A |
| 3 | 18 | 3000 | A | B | C | D | E | F |
| 4 | 19 | 3000 | F | E | D | C | B | A |
| 5 | 20 | 1500 | F | F | — | — | — | — |
| 6 | 21 | 1500 | E | E | — | — | — | — |
| 7 | 22 | 1500 | D | D | — | — | — | — |
| 8 | 23 | 1500 | C | C | — | — | — | — |
| 9 | 24 | 1500 | B | B | — | — | — | — |
| 10 | 25 | 1500 | A | A | — | — | — | — |

KEY:
A = Solution - 100% SBT solution
B = Solution - Mixture of 80% SBT solution and 20% $ZrO_2$ solution
C = Solution - Mixture of 60% SBT solution and 40% $ZrO_2$ solution
D = Solution - Mixture of 40% SBT solution and 60% $ZrO_2$ solution
E = Solution - Mixture of 20% SBT solution and 80% $ZrO_2$ solution
F = Solution - 100% $ZrO_2$ solution A first spincoat of 0.1 molar solution of a precursor mixture with a composition selected from A through F was deposited on bottom electrode 818 at a selected spin rate, indicated in Table 1 in rpm, for 40 seconds. The deposited spin coating was dried for one minute at 160° C., then at 260° C. for four minutes. The first spincoat was given a furnace anneal at 800° C. for 10 minutes using an oxygen flowrate of five liters/minute, with a 10 minute "push" into the furnace and a 10 minute "pull" from the furnace. This sequence of the spincoat, drying and anneal steps was repeated for each subsequent spincoat, for a total of six spincoats for Samples 1 though 4, and a total of two spincoats for Samples 5 through 10. The thin films formed had a total thickness of about 260 nm or less.

Standard crystallographic x-ray measurements were performed on Samples 1–10. After the x-ray measurements, a platinum top electrode layer (not shown in FIGS. 18–25) with about 200 nm thickness was deposited on the thin film of each sample wafer. The platinum and ferroelectric FGM thin film layers were ion-milled to form capacitors, and then ashing was performed, followed by a second $O_2$ anneal for 30 minutes at 800° C. The capacitors had a surface area of about 6900 square microns. The capacitance was measured in the capacitor of Sample 2, and a fatigue test was performed on Sample 3.

Figure 18:
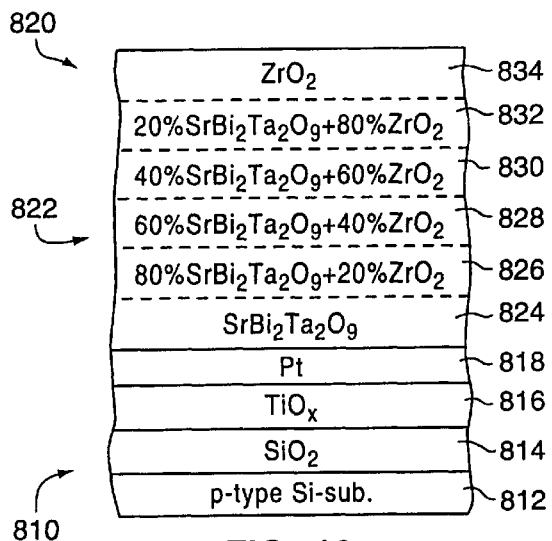
FIG. 18 is a schematic diagram of an experimental ferroelectric FGM thin film formed by a liquid spin-on method in accordance with the invention, in which the ferroelectric compound was strontium bismuth tantalate and the dielectric compound, $ZrO_2$, had a positive concentration gradient in the upwards direction.
Figure 19:
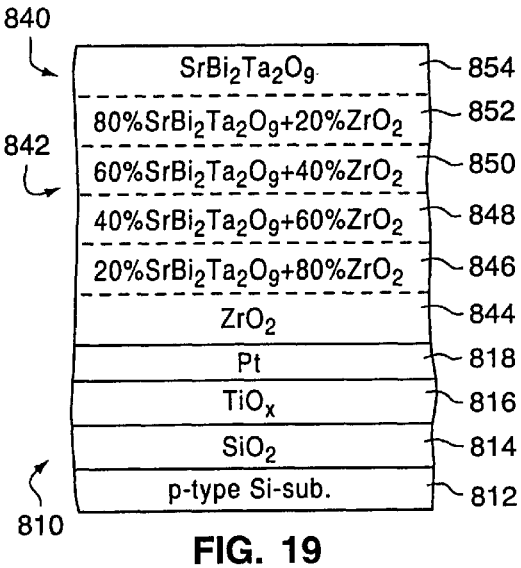
FIG. 19 is a schematic diagram of an experimental ferroelectric FGM thin film formed by a liquid spin-on method in accordance with the invention, in which the ferroelectric compound was strontium bismuth tantalate and the dielectric compound, $ZrO_2$, had a negative concentration gradient in the upwards direction.
Figure 20:
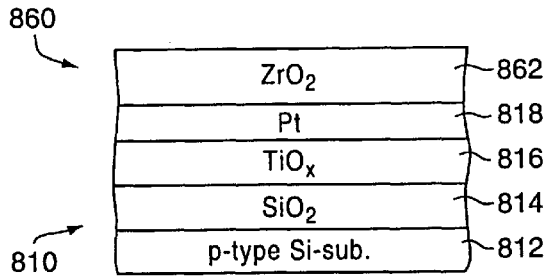
FIG. 20 is a schematic diagram of an experimental thin film comprising only dielectric compound, $ZrO_2$.
Figure 21:
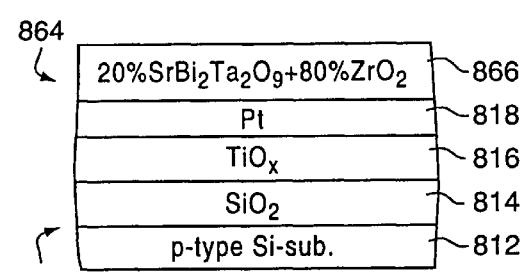
FIGS. 21–24 are schematic diagrams of an experimental thin film made from a precursor mixture for strontium bismuth tantalate ("SBT") and $ZrO_2$, but having no functional gradient in accordance with the invention.
Figure 22:
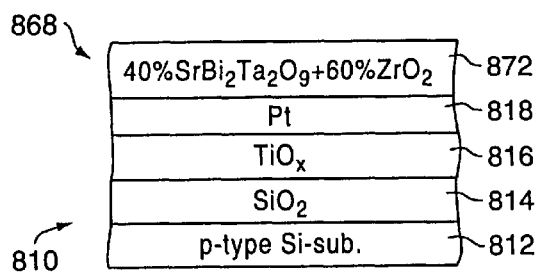
Figure 23:
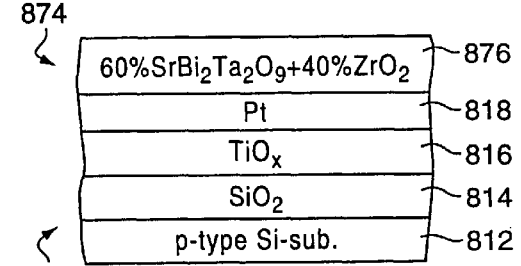
Figure 24:
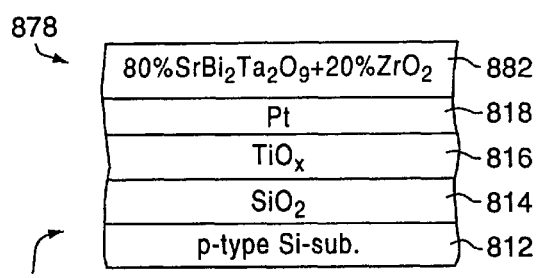
Figure 25:
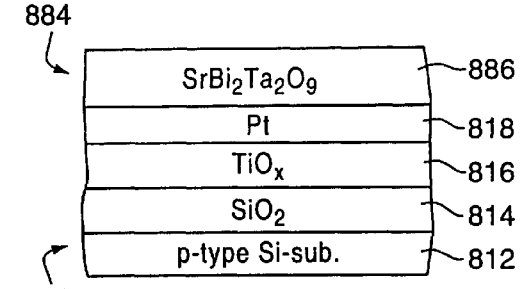
FIG. 25 is a schematic diagram of an experimental thin film comprising only the ferroelectric compound, SBT.

Sample No. 1, having a FGM thin film corresponding to the structure shown in FIG. 18, was formed by depositing and treating six successive coats of liquid precursor. The precursor coats had the composition indicated in Table 1, with the first coat being a solution of SBT, coats 2–5 having increasing proportions of $ZrO_2$-precursor, and spin-coat 6 containing only $ZrO_2$-precursor. Thus, the thin film in Sample 1 had six lateral regions, 824, 826, 828, 830, 832 and 834, in which the concentration gradient of SBT or constituent atoms of SBT was negative in the upward vertical direction, and the concentration gradient of $ZrO_2$ and Zr-atoms was positive in the upward vertical direction. In Sample 2, as depicted in FIG. 19, the order of spin-coating was reversed. The corresponding thin film 842 had six lateral regions, 844–854, in which the concentration gradient of SBT or constituent atoms of SBT was positive in the upward vertical direction, and the concentration gradient of $ZrO_2$ and Zr-atoms was negative in the upward vertical direction. Sample 3 was formed using the same sequence of steps as for Sample 1, except the spin rate was 3000 rpm, instead of 1500 rpm. Similarly, Sample 4 was fabricated using the same steps as Sample 2, but the spin rate was 3000 rpm.

In contrast to Samples 1–4, the thin films in Samples 5–10 were not FGM thin films; that is, they were not formed with a concentration gradient across lateral regions. To make Samples 5–10, two individual spin-coats were applied and treated sequentially. But, as shown in Table 1 and in the corresponding FIGS. 20–25, the precursor composition was the same in each of the two individual spin-coats. As a result, the composition was uniform throughout each thin film. The thin film in Sample 5, corresponding to FIG. 20, was formed with pure $ZrO_2$ precursor. In Sample 6 (FIG. 21), the precursor mixture was 20% SBT precursor. As shown in Table 1 and in FIGS. 23–25, the proportion of SBT precursor in the spin-on precursor increased stepwise, so that the thin film precursor for Sample 10 (FIG. 25) was pure SBT precursor.

Figure 26:
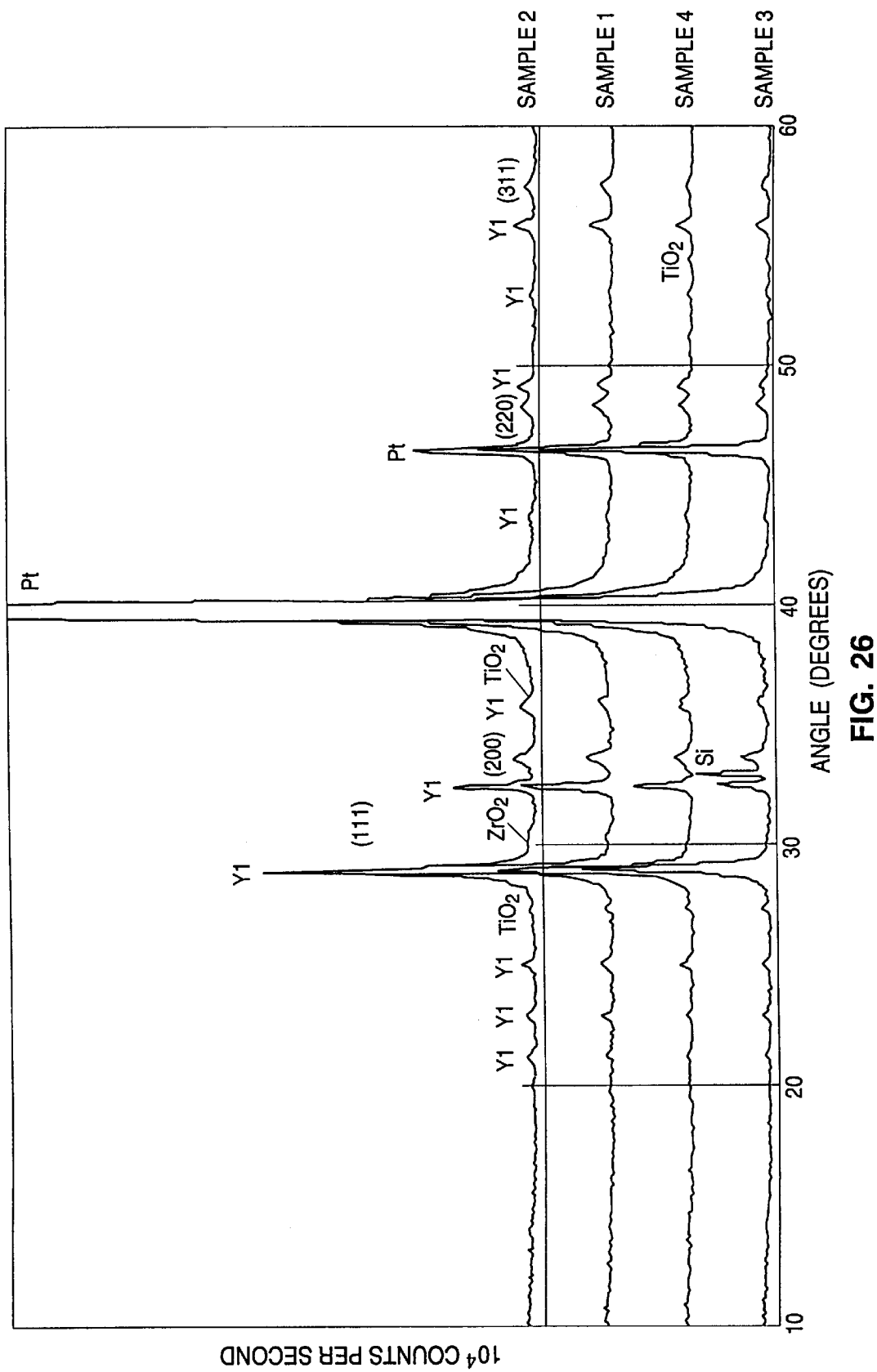
FIG. 26 shows the results of conventional crystallographic x-ray analyses of ferroelectric FGM thin films fabricated in accordance with the invention.

In FIG. 26, the results of conventional crystallographic x-ray analyses of Samples 1–4 are depicted. In FIG. 26, the peaks associated with the ferroelectric layered superlattice material SBT are labeled "Y1". The peaks for SBT are very apparent in the experimental results of Samples 1 and 2, with the peaks somewhat more pronounced for Sample 2 (FIG. 19). This is to be expected, since the concentration of SBT is highest near the top of the thin film, from which the x-ray analyses are performed. The peaks in Samples 3 and 4 are less pronounced than in Samples 1 and 2. Samples 3 and 4 were fabricated using the same process as for Samples 1 and 2, except the spin rate was 3000 rpm for Samples 3 and 4, instead of 1500 rpm.

Figure 27:
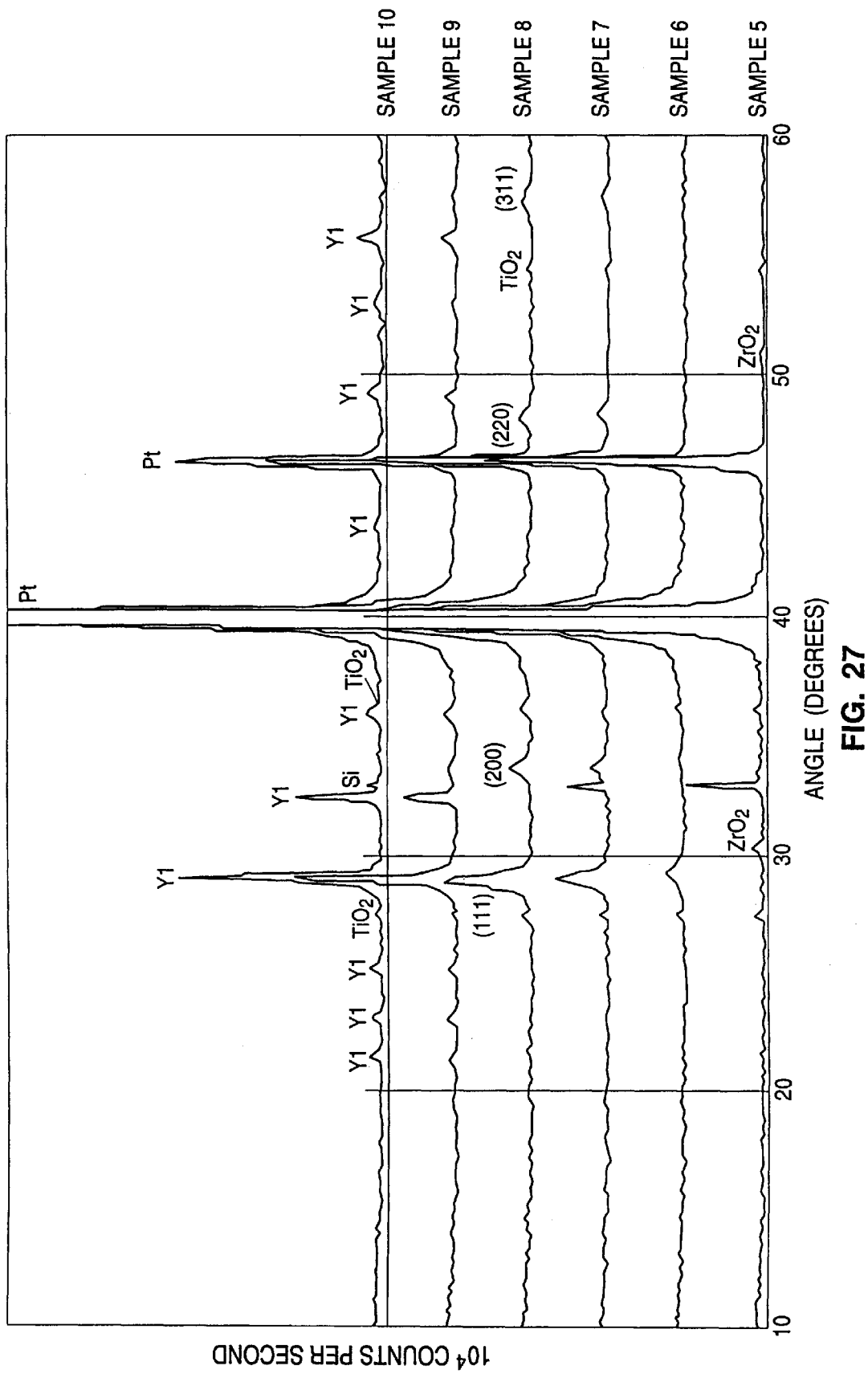
FIG. 27 shows the results of conventional crystallographic x-ray analyses of thin films made from mixtures of precursors for the ferroelectric compound, SBT, and the dielectric compound, $ZrO_2$, but having no functional gradient.

In FIG. 27, the results of conventional crystallographic x-ray analyses of Samples 5–10 are depicted. In FIG. 27, the peaks associated with the ferroelectric layered superlattice material SBT are labeled "Y1". The peaks for SBT are most apparent in the experimental results of Sample 10, in which the thin film (FIG. 25) was made with a pure SBT precursor. In Sample 9, which was fabricated from a precursor mixture with 20 mole percent $ZrO_2$ and 80% SBT (FIG. 24), the SBT peaks were clearly attenuated. In Samples 7 and 8 (FIGS. 22 and 23, respectively) no SBT peaks were discernible; the (1,1,1) lattice peak could be asociated with a number of other unrelated crystalline compounds. Similarly, in Samples 5 and 6 (FIGS. 20 and 21, respectively), no SBT peaks could be identified.

Comparison of the experimental results depicted in FIGS. 26 and 27 show clearly the utility of the FGM structure. The functional gradient FGM thin films of Samples 1–4 clearly exhibited SBT peaks, even though the molar proportion of SBT averaged for the entire thin film was only 50%. In fact, the results of measurements of Samples 1 and 2 were very similar to the results for Sample 10, in which the thin film was 100% SBT. In contrast, the results for Sample 8, which contained 60% SBT in a non-FGM thin film, show no SBT peaks.

Figure 28:
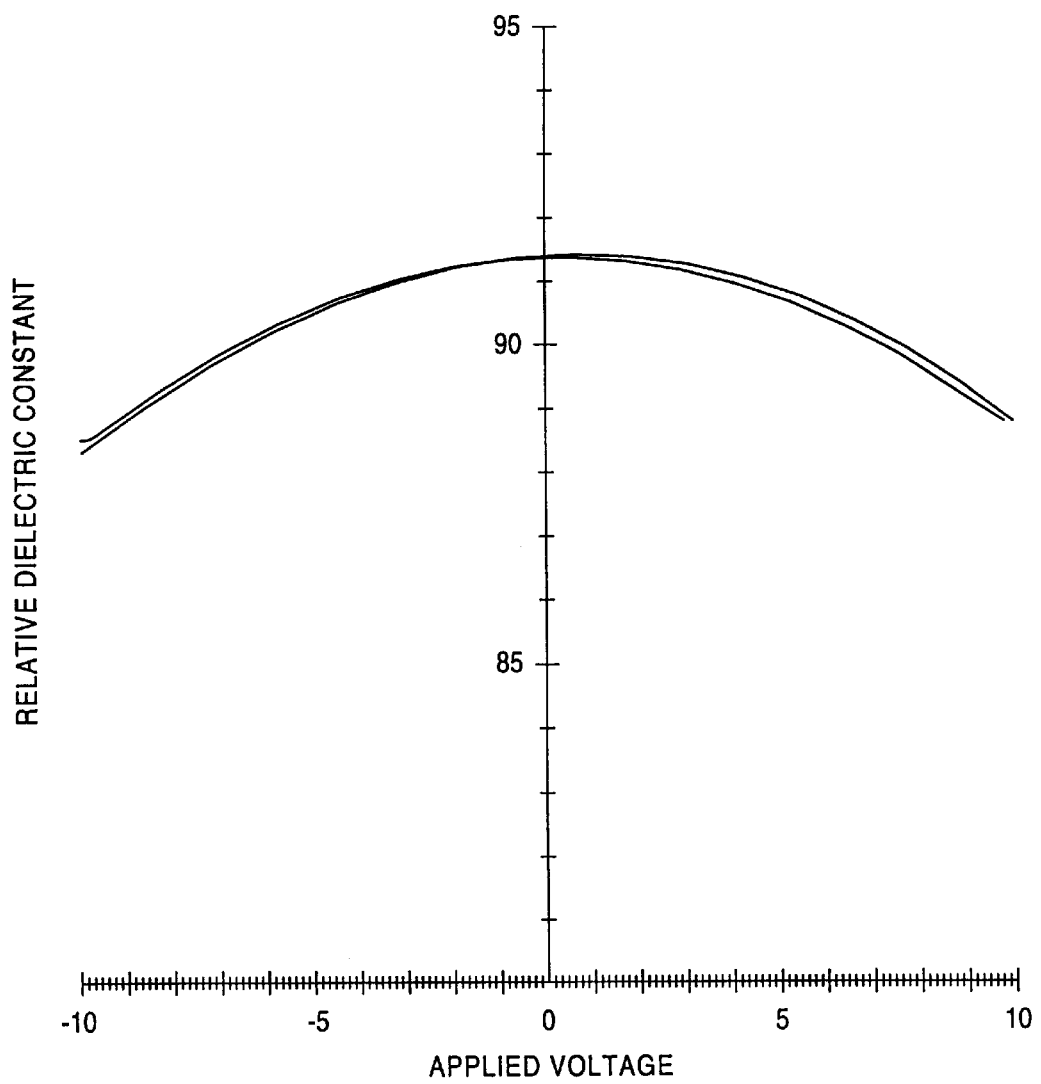
FIG. 28 is a graph of the relative dielectric constant as a function of the applied voltage in a ferroelectric FGM thin film made in accordance with the invention.

The capacitance measurements of Sample 2 were converted to values of relative dielectric constant and plotted in the graph of FIG. 28. The dielectric constant of the FGM thin film of Sample 2 (FIG. 19) has a value of about 90, which is a desired decrease from the typical value of about 400 for SBT thin films. The dependence of the dielectric constant on voltage in the voltage range of ±10 volts shows the ferroelectric nature of the FGM thin film. A fatigue test was performed on Sample 3 by subjecting the capacitor to $3.2 \times 10^{10}$ triangular wave cycles with an amplitude of 10 volts and 1 MHZ frequency. Differences in the polarizability of the ferroelectric FGM thin film before and after the cycling could not be discerned from polarization measurements. This confirmed the resistance to fatigue of SBT in FGM thin films.

EXAMPLE 2

FGF thin films containing functional gradients of PZT were fabricated using a MOD technique. Five metal alkoxide precursors containing lead, zirconium and titanium were prepared in which the relative molar compositions of zirconium and titanium, Zr/Ti, were 55/45, 60/40, 65/35, 70/30 and 75/25, respectively. Ten percent excess lead was incorporated to compensate for loss of lead through volatilization at the elevated substrate temperature during treating. The five precursor solutions were spin coated on $Si/SiO_2/Ti(20$ nm$)/Pt(200$ nm$)$ substrate in sequence. Each layer was baked at 160° C. for two minutes and 260° C. for four minutes before spinning the next layer. The film was then annealed at 600° C. for 30 minutes in oxygen atmosphere for crystallization. The thickness of the PZT-FGF thin film was 260 nm. After the anneal, a top electrode of platinum with a thickness of 200 nm was sputtered, followed by backend processing of patterning and final anneal to form a metal-ferroelectric-metal ("MFM") capacitor. The areas of the capacitors ranged from 1000 to 46,000 $\mu m^2$.

Figure 29:
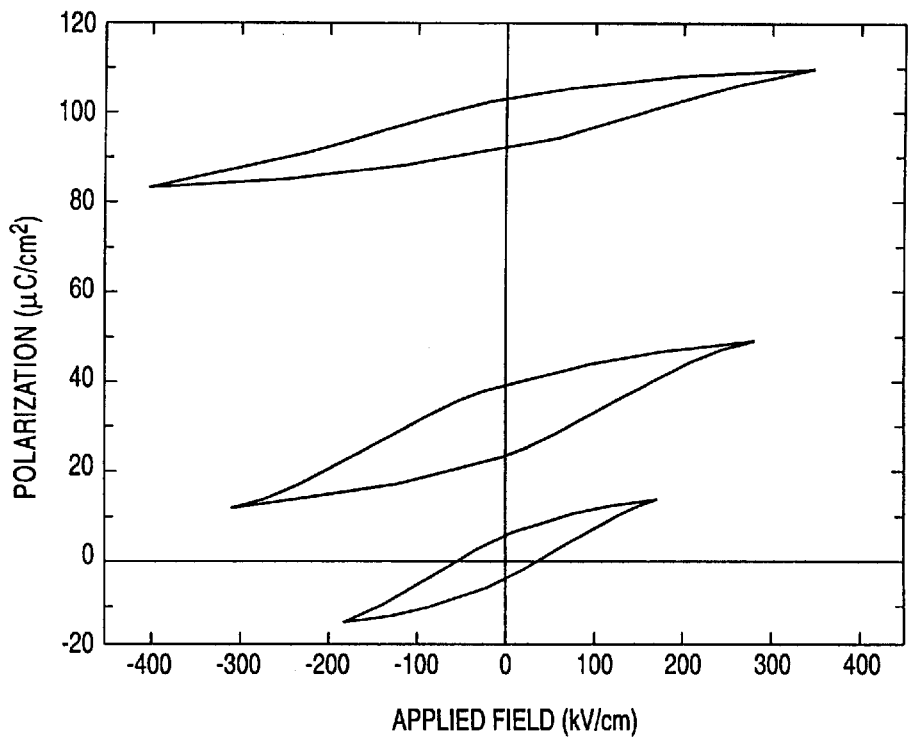
FIG. 29 is a graph of hysteresis curves measured in a FGF capacitor when voltage was applied to its top electrode and in which the polarization charge shifted upward with the increase of applied voltage from 5V to 10V.
Figure 30:
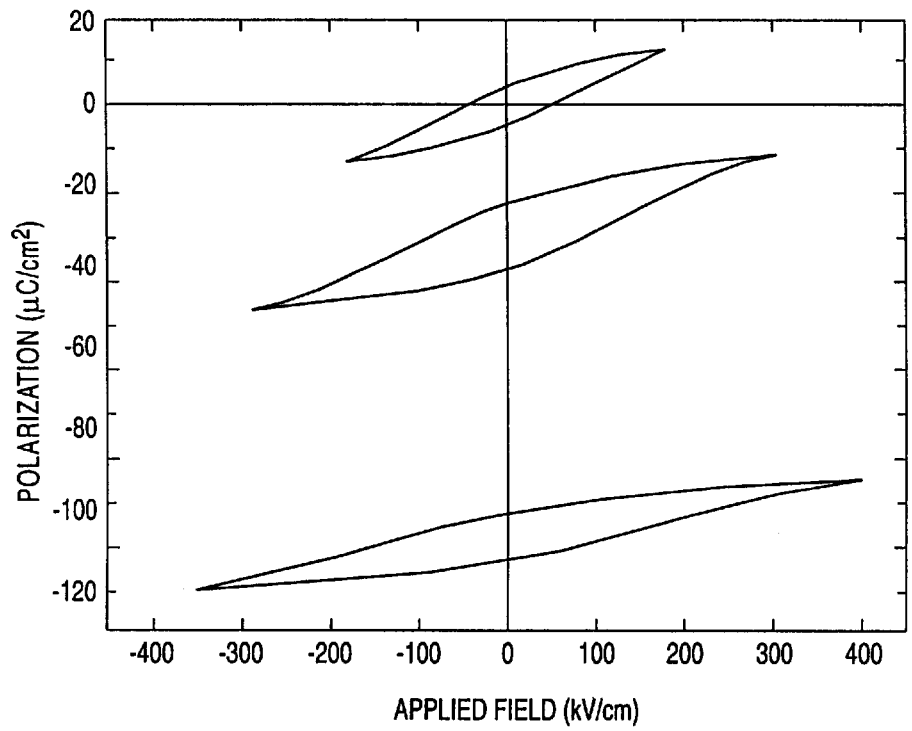
FIG. 30 is a graph of hysteresis curves measured in the FGF capacitor of FIG. 29 when voltage was applied to its bottom electrode and in which the polarization charge shifted downward with the increase of applied voltage from 5V to 10V.

Hysteresis curves were measured by applying 10 kHz sinusoidal signals of 5, 8 and 10 volts, respectively to an exemplary capacitor. The results of the measurements are depicted in the graphs of FIGS. 29 and 30. As shown in FIG. 29, when the sinusoidal wave was applied to the top electrode, polarization charge shifted upward with the increase of applied voltage from 5V to 10V. As shown by the graph of FIG. 30, however, when the sinusoidal wave was applied to the bottom electrode, the polarization charge shifted downward with the increase of applied voltage. Analysis of the results shown in FIGS. 29 and 30 indicates that the direction of polarization shift is related to the direction of the compositional gradient of the FGF thin film. Thus, unconventional hysteresis behavior is related to the functional gradient of the FGF thin film. Moreover, the larger the applied voltage, the greater the degree of shift.

Figure 31:
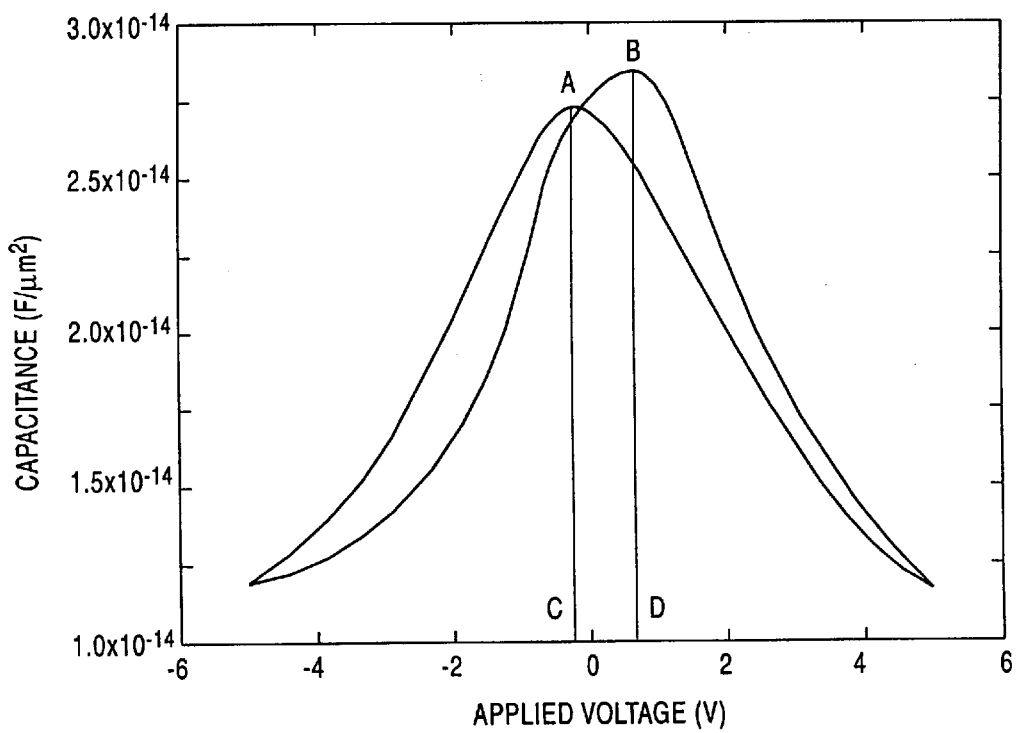
FIG. 31 shows the results of small signal capacitance versus voltage ("C-V") measurements at 1 MHz with a bias from –5V to +5V in the FGF capacitor of FIGS. 29–30 when the voltage bias is applied to the top electrode.
Figure 32:
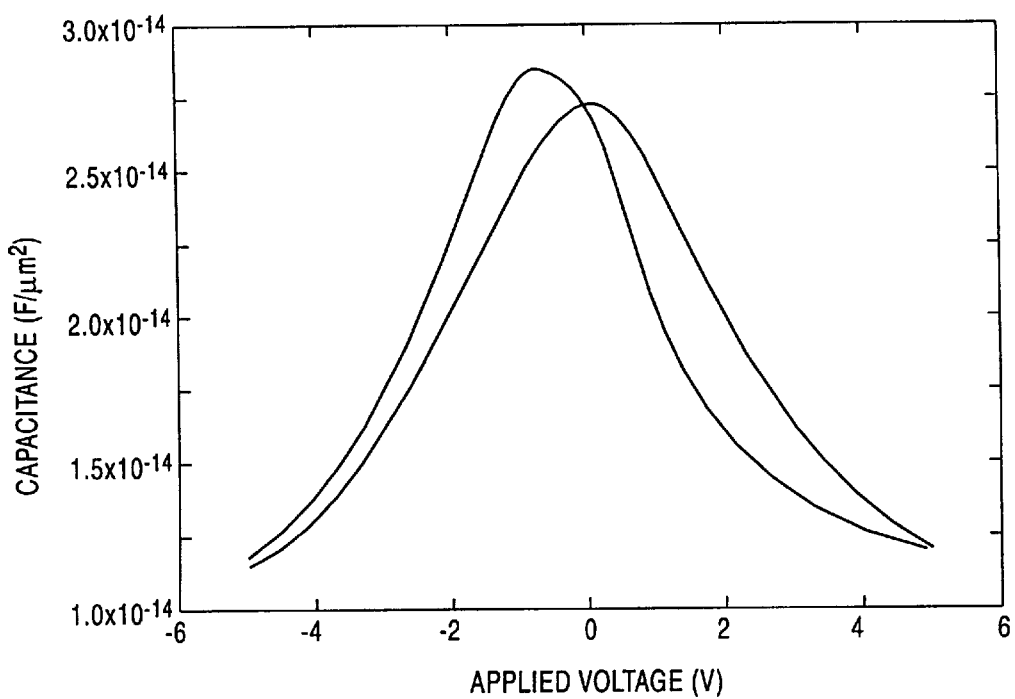
FIG. 32 shows the results of small signal capacitance versus voltage ("C-V") measurements at I MHz with a bias from –5V to +5V in the FGF capacitor of FIGS. 29–31 when the voltage bias is applied to the bottom electrode.

The graphs of FIGS. 31 and 32 show the results of small signal capacitance versus voltage ("C-V") measurements at 1 MHz with a bias from −5V to +5V. There is a distinct difference between the curves produced when the voltage bias is applied to the top electrode (FIG. 31) and the curves produced when the voltage bias is applied to the bottom electrode (FIG. 32). The difference in the two capacitance peaks A and B in FIG. 31 indicate that the FGF thin film has a directional dependence, which manifests itself in the asymmetry between positive and negative bias. The voltage difference between the two points C and D where the two maxima occur indicates a built-in field in the FGF material.

EXAMPLE 3

Metal-ferroelectric-metal ("MFM") and metal-insulator-semiconductor ("MIS") capacitors were formed. The MFM capacitors were made using precursors for forming layered superlattice material corresponding to the stoichiometric formula $SrBi_{2.2}(Ta_{1-x}Nb_x)_2O_9$, where x=1 or x=0.8. The MFM capacitors showed unconventional hysteresis. The MFM and MIS structures were connected in series to form a MFM-MIS circuit. Capacitance versus voltage ("C-V") measurements of the MFM-MIS circuit were performed to determine the memory window, $\Delta V$, and the relationship of $\Delta V$ to $V_c$.

Initial MOD precursor solutions respectively comprising strontium 2-ethylhexanoate, bismuth 2-ethylhexanoate, niobium 2-ethylhexanoate and tantalum 2-ethylhexanoate (when applicable) in n-octane solvent were used to prepare a 0.2 molar final precursor solution.

A ferroelectric thin film was prepared from the final liquid precursor solution. The 0.2 molar final liquid precursor was made by mixing the initial individual metalorganic precursors for each of the metal elements corresponding to the empirical formula $SrBi_{2.2}(Ta_{0.2}Nb_{0.8})_2O_9$ or $SrBi_{2.2}Nb_2O_9$.

The formation of ferroelectric capacitors containing the layered superlattice compound was described in Watanabe, U.S. Pat. No. 5,434,102, which is hereby incorporated by reference as if wholly contained herein.

A series of prime grade (100)-oriented p-type Si wafers were oxidized to form silicon dioxide layers. A layer consisting substantially of titanium was deposited on the substrate. The titanium was oxidized in a furnace anneal to form a $TiO_2$ layer. Then a platinum bottom electrode having a thickness of 300 nm was formed. Next, the wafers were dehydrated for 30 minutes at 180° C. in low vacuum.

The final precursor solution was applied onto the substrate using a spin-on technique. Two liquid coatings were applied to the samples. Just prior to use, the final liquid precursor was diluted to 0.1 molar concentration by adding n-butyl acetate. A first spincoat of 0.1 molar solution of the final precursor was deposited on bottom electrode 318 at 1100 rpm for 40 seconds. This was dried for one minute at 160° C., and at 260° C. for four minutes. The first spincoat annealed at 800° C. for 10 minutes with an oxygen flowrate of 5 liters/minute, with 10 minutes "push" and 10 minutes "pull". This sequence of the spin-coating and drying was repeated for a second spincoat. After drying the second spin-coat, the wafer was annealed at 800° C. for 60 minutes with an oxygen flowrate of 5 liters/minute, with 10 minutes "push" and 10 minutes "pull". Platinum was sputter-deposited to make top electrode layer 322 with 200 nm thickness. The platinum and ferroelectric thin film layers were ion-milled to form the capacitors, and then ashing was performed, followed by a second $O_2$ anneal for 30 minutes at 800° C. The capacitors were patterned so that the MFM capacitors had surface areas, AMFM, of 4301 and 6940 square microns.

To make each of the MIS structures, a prime grade (100)-oriented p-type silicon wafer having a resistivity of 6–10Ω-cm was cleaned by dipping in a $H_2O_2/NH_4OH/H_2O$ solution (volume ratio 1/1/8) at 70° C. for 30 minutes. The wafer was rinsed in deionized water and dried. Then the wafer was dipped in 20:1 buffered HF solution for 20–30 seconds, rinsed in deionized water and dried.

An MOD method was used to deposit a $ZrO_2$ insulator layer on the silicon substrate. A 0.2M n-octane based solution of zirconium 2-ethylhexanoate was diluted to 0.1 M by adding n-butyl acetate. A liquid coating of the 0.1 M solution was applied using a spin-on technique, with a coater speed of 1500 rpm for 40 seconds. The coating was dried at 160° C. for one minute, then at 260° C. for four minutes. The spin-coating and drying steps were repeated twice, for a total of three coats. The solid coating was then furnace-annealed for 60 minutes at 800° C. in oxygen flowing at 5 liters/minute, with 10 minutes "push" and 10 minutes "pull". Measurements using Auger electron spectroscopy ("AES") and transmission electron microscopy ("TEM") indicated that the $ZrO_2$-layer had a thickness of about 13 nm. As a result of the fabrication steps, oxide layer of $SiO_2$ having a thickness of 7 nm was formed by oxidation of the silicon substrate.

A platinum layer with a thickness of about 200 nm was sputter deposited on $ZrO_2$ insulator layer. Then the platinum layer was ion-milled to form electrodes, followed by a furnace-anneal in oxygen for 30 minutes at 800° C. After that, the top of the wafer was covered with photoresist while the back side of the wafer was cleaned in a 20:1 buffered HF solution for about two minutes and rinsed in deionized water. An aluminum layer having a thickness of 600 nm was sputter deposited onto the back of the wafer using a DC sputtering tool. After removal of the photoresist, the wafer was then furnace-annealed in nitrogen for 30 minutes at 450° C. The MIS capacitors had surface areas, $A_{MIS}$, of 46759 square microns.

Figure 33:
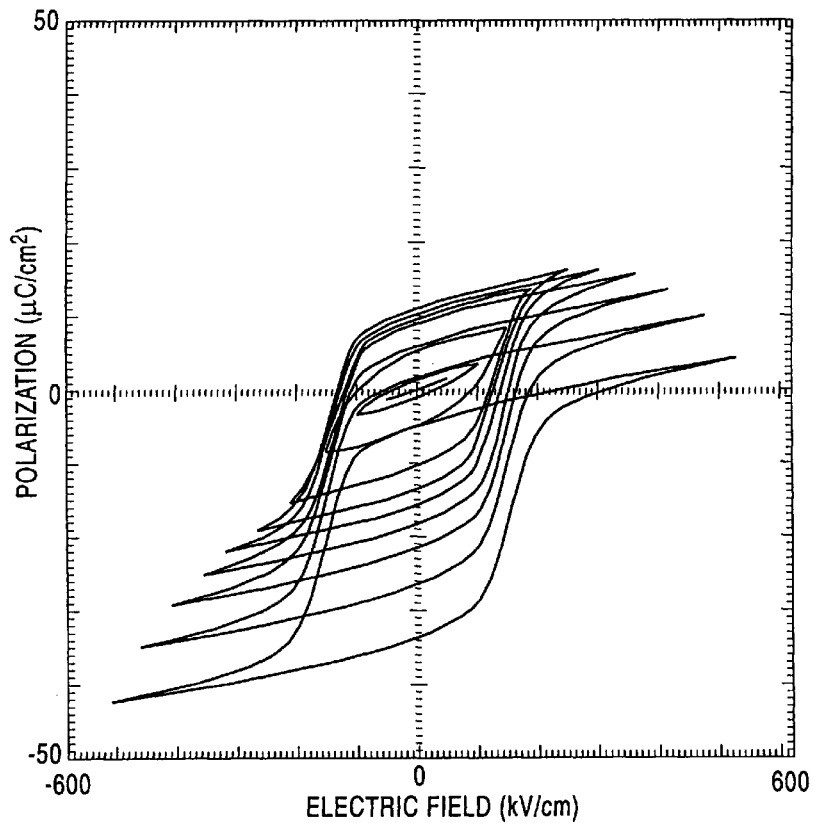
FIG. 33 shows the hysteresis curve in a MFM capacitor containing a layered superlattice material when bias voltage was applied to the top electrode, and in which the polarization charge shifted downwards as applied voltage increased.
Figure 34:
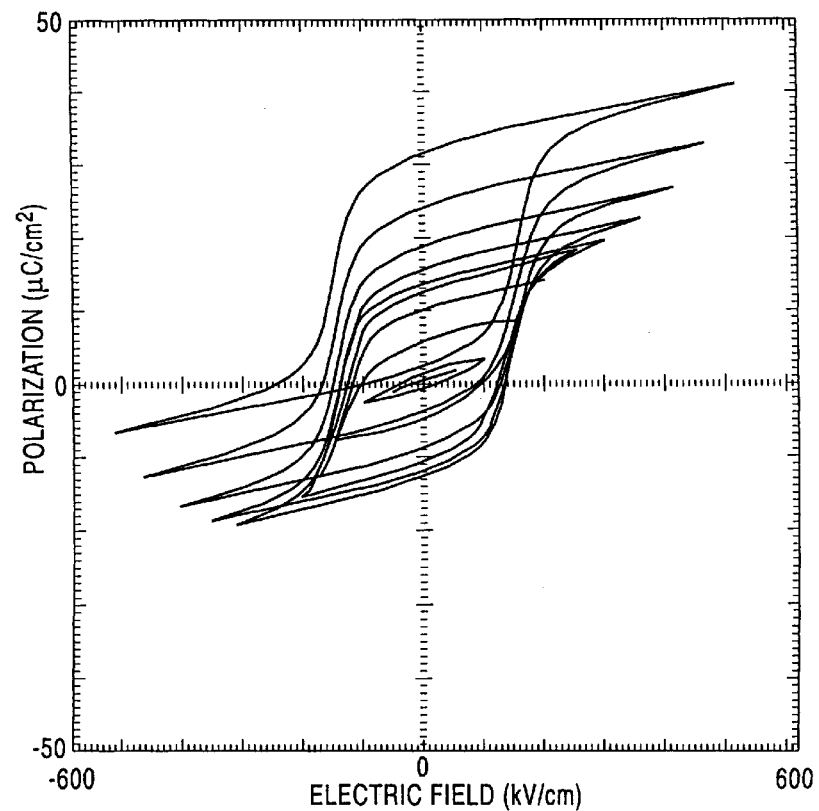
FIG. 34 shows the hysteresis curve in the MFM capacitor of FIG. 33 when bias voltage was applied to the bottom electrode, and in which the polarization charge shifted upwards as applied voltage increased.

FIGS. 33 and 34 show the results of polarization measurements of an exemplary MFM capacitor formed using the precursor having metal moieties corresponding to the stoichiometric formula $SrBi_{2.2}Nb_2O_9$. The area of the tested exemplary MFM capacitor was 6940 $\mu m^2$. Hysteresis curves were generated by applying 10 kHz sinusoidal signals to an exemplary capacitor. As shown in FIG. 33, when the sinusoidal wave was applied to the top electrode, polarization charge shifted downwards as applied voltage increased. As shown by the graph of FIG. 34, however, when the sinusoidal wave was applied to the bottom electrode, the polarization charge shifted upward with the increase of applied voltage. Moreover, the larger the applied voltage, the greater the degree of shift. This type of unconventional hysteresis behavior is similar to the behavior observed in the FGF of Example 2. Similar measurements were performed on an exemplary MFM capacitor formed using the precursor having metal moieties corresponding to the stoichiometric formula $SrBi_{2.2}(Ta_{0.2}Nb_{0.8})_2O_9$. Unconventional hysteresis behavior similar to that depicted in FIGS. 33 and 34 was measured.

Figure 35:
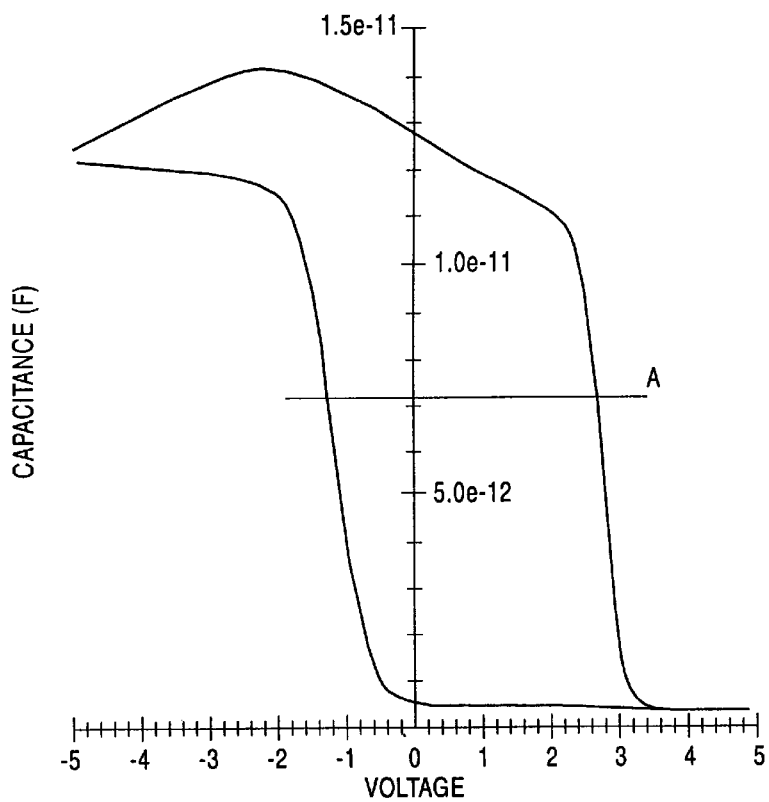
FIG. 35 shows the C-V curve when the bottom electrode of a MFM capacitor similar to the capacitor of FIGS. 33–34 was connected to the metal electrode of the MIS in a MFM-MIS series circuit.
Figure 36:
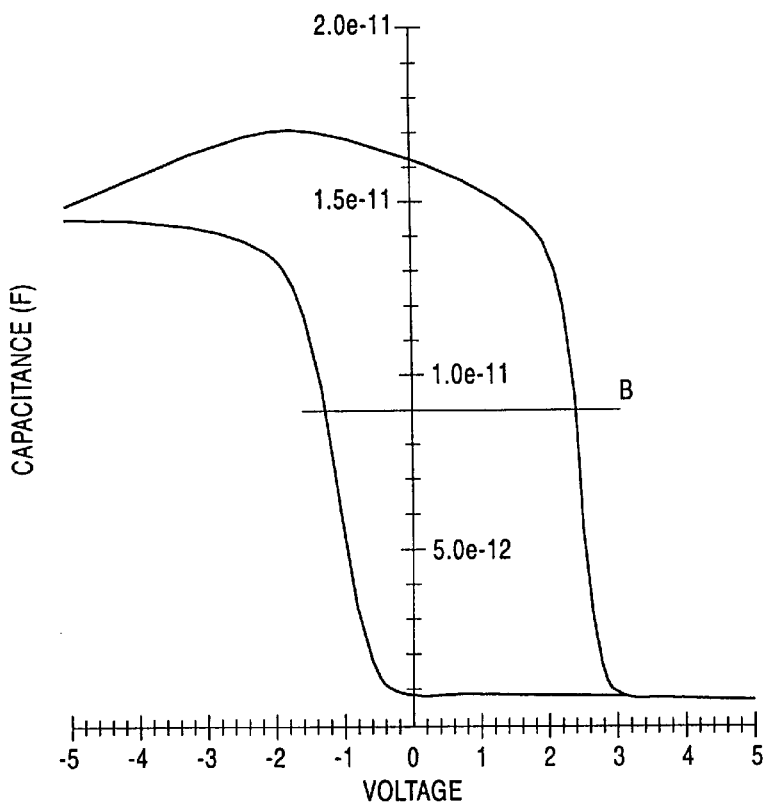
FIG. 36 shows the C-V curve when the top electrode of the MFM capacitor of FIG. 35 was connected to the metal electrode of the MIS.

FIGS. 35 and 36 are graphs showing the results of C-V measurements performed on a MFM-MIS circuit, which approximates a ferroelectric FET, but without the source and drain regions. The MFM capacitor had the same composition as the capacitor discussed with respect to FIGS. 33 and 34, that is, $SrBi_{2.2}Nb_2O_9$, but had an area of 4301 $\mu m^2$. The threshold voltage shift, or "memory window", $\Delta V$, was calculated by measuring the maximum voltage difference between the backward and forward sweeps on the graph. FIG. 35 shows the C-V curve when the bottom electrode of the MFM capacitor was connected to the metal electrode of the MIS. The memory window, $\Delta V$, as measured between the arrows of line A, was about 4.0 volts. FIG. 36 shows the C-V curve when the top electrode of the MFM capacitor was connected to the metal electrode of the MIS. The memory window, $\Delta V$, as measured between the arrows of line B, was about 3.6 volts. Thus, the memory window, $\Delta V$, of the MFM-MIS system measured was considerably greater than the values of memory windows of similar structures reported in the prior art. It is believed that the enlarged memory window is directly related to the unconventional hysteresis behavior measured in the MFM capacitor. The unconventional hysteresis behavior measured here is similar to the unconventional hysteresis behavior observed in FGF thin films having compositional gradients.

There has been described a method and structure for fabricating ferroelectric integrated circuits that provide ferroelectric NDRO FET memories having high circuit density with good electrical properties. It should be understood that the particular embodiments shown in the drawings and described within this specification are for purposes of example and should not be construed to limit the invention which will be described in the claims below. For example, the invention contemplates that the ferroelectric FGM thin films may be made of any ferroelectric material. The ferroelectric compound of the invention, therefore, is not limited to only strontium bismuth tantalate or other layered superlattice material. The ferroelectric FGM thin film may comprise several gradients of either the dielectric or the ferroelectric compound. Or the FGM may comprise gradients of ferroelectric compounds, as in a FGF thin film.

Further, it is evident that those skilled in the art may now make numerous uses and modifications of the specific embodiments described, without departing from the inventive concepts. For example, now that methods and structures to provide a ferroelectric functional gradient material in an integrated circuit have been identified as an important part of the process for fabricating ferroelectric nondestructive readout FET memory devices, these structures and methods can be combined with other structures and processes to provide variations on the invention described. It is also evident that the steps recited may in some instances be performed in a different order; or equivalent structures and processes may be substituted for the structures and processes described. Consequently, the invention is to be construed as embracing each and every novel feature and novel combination of features present in and/or possessed by the fabrication processes, electronic devices, and electronic device manufacturing methods described.

We claim:

1. A ferroelectric memory including a ferroelectric FET comprising:
   a semiconductor substrate;
   a ferroelectric functionally graded material (FGM) thin film less than a micron in thickness and comprising a layered superlattice material; and
   a gate electrode.

2. A ferroelectric memory including a ferroelectric FET as in claim 1, wherein said ferroelectric FGM thin film is located above said semiconductor substrate, and said gate electrode is located above said ferroelectric FGM thin film.

3. A ferroelectric memory including a ferroelectric FET as in claim 1, wherein said gate electrode is located on said ferroelectric FGM thin film.

4. A ferroelectric memory including a ferroelectric FET as in claim 1, wherein said ferroelectric FGM thin film is located on said semiconductor substrate.

5. A ferroelectric memory including a ferroelectric FET as in claim 1, further comprising a gate oxide layer located on said semiconductor substrate.

6. A ferroelectric memory including a ferroelectric FET as in claim 5, wherein said ferroelectric FGM thin film is located on said gate oxide layer.

7. A ferroelectric memory including a ferroelectric FET as in claim 5, further comprising an interface insulator layer located on said gate oxide layer.

8. A ferroelectric memory including a ferroelectric FET as in claim 1, further comprising an interface insulator layer located between said ferroelectric FGM thin film and said semiconductor substrate.

9. A ferroelectric memory including a ferroelectric FET as in claim 8, wherein said interface insulator layer is located on said semiconductor substrate.

10. A ferroelectric memory including a ferroelectric FET as in claim 9, wherein said ferroelectric FGM thin film is located on said interface insulator layer.

11. A ferroelectric memory including a ferroelectric FET as in claim 1, further comprising a floating electrode located between said semiconductor substrate and said ferroelectric FGM thin film.

12. A ferroelectric memory including a ferroelectric FET as in claim 11, further comprising an adhesion layer located between said floating electrode and said semiconductor substrate.

13. A ferroelectric memory including a ferroelectric FET as in claim 12, wherein said floating electrode is located on said adhesion layer, and said ferroelectric FGM thin film is located on said floating electrode.

14. A ferroelectric memory including a ferroelectric FET as in claim 1, wherein said ferroelectric FGM thin film contains moieties of first metal atoms in relative molar proportions corresponding to a stoichiometric formula of said layered superlattice material and moieties of second metal atoms in relative molar proportions corresponding to a stoichiometric formula of a dielectric compound, said dielectric compound having a dielectric constant less than said layered superlattice material, and said ferroelectric FGM thin film having a functional gradient of said moieties of first metal atoms and second metal atoms.

15. A ferroelectric memory including a ferroelectric FET as in claim 14, wherein said dielectric compound comprises an oxide selected from the group consisting of $ZrO_2$, $CeO_2$, $Y_2O_3$ and $Ce_{1-x}Zr_xO_2$, where $0 \leq x \leq 1$.

16. A ferroelectric memory including a ferroelectric FET as in claim 14, wherein said ferroelectric FGM thin film comprises at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium.

17. A ferroelectric memory including a ferroelectric FET as in claim 16, wherein said first metal atoms include the metals strontium, bismuth, tantalum, and niobium.

18. A ferroelectric memory including a ferroelectric FET as in claim 17, wherein said first metal atoms include the metals strontium, bismuth and tantalum in relative molar proportions corresponding to a stoichiometric formula $SrBi_{2+y}(Ta_{1-x}Nb_x)_2O_9$, wherein $0 \leq x \leq 1$ and $0 \leq y \leq 0.20$.

19. A ferroelectric memory including a ferroelectric FET as in claim 1, wherein said ferroelectric FGM thin film is a functionally graded ferroelectric (FGF) thin film, said FGF thin film containing moieties of a plurality of types of metal atoms in relative molar proportions corresponding to stoichiometric formulas of said layered superlattice material and a second ferroelectric compound, said FGM thin film having a functional gradient of said moieties of metal atoms.

20. A ferroelectric memory including a ferroelectric FET as in claim 19, wherein said second ferroelectric compound is a ferroelectric metal oxide.

21. A ferroelectric memory including a ferroelectric FET as in claim 20, wherein said ferroelectric metal oxide is an $ABO_3$-type perovskite.

22. A ferroelectric memory including a ferroelectric FET as in claim 21, wherein said types of metal atoms include lead, zirconium and tantalum, and said stoichiometric formulas include a formula represented by a generalized stoichiometric formula $Pb(Zr_{1-x}Ti_x)O_3$, wherein x varies in correspondence with said functional gradient and $0 \leq x \leq 1$.

23. A ferroelectric memory including a ferroelectric FET as in claim 22, wherein $0.25 \leq x \leq 0.45$.

24. A ferroelectric memory including a ferroelectric FET as in claim 20, wherein said second ferroelectric compound is a layered superlattice material.

25. A ferroelectric memory including a ferroelectric FET as in claim 24, wherein said FGF thin film comprises at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium.

26. A ferroelectric memory including a ferroelectric FET as in claim 25, wherein said types of metal atoms include strontium, bismuth, tantalum and niobium.

27. A ferroelectric memory including a ferroelectric FET as in claim 26, wherein said stoichiometric formulas are represented by a generalized stoichiometric formula $SrBi_2(Ta_{1-x}Nb_x)_2O_9$, wherein x varies in correspondence with said functional gradient and $0 \leq x \leq 1$.

28. A ferroelectric memory including a ferroelectric FET comprising:
   a semiconductor substrate;
   a ferroelectric thin film; and
   a gate electrode; wherein said ferroelectric thin film comprises ferroelectric layered superlattice material having unconventional hysteresis behavior.

29. A ferroelectric memory including a ferroelectric FET as in claim 28, wherein said layered superlattice material comprises the metals strontium, bismuth, tantalum and niobium in relative molar proportions corresponding to a stoichiometric formula $SrBi_{2+y}(Ta_{1-x}Nb_x)_2O_9$, wherein $0 \leq x \leq 1$ and $0 \leq y \leq 0.20$.

* * * * *